(12) United States Patent
Amo

(10) Patent No.: US 10,847,628 B2
(45) Date of Patent: Nov. 24, 2020

(54) SEMICONDUCTOR DEVICE AND MANUFACTURING METHOD OF SEMICONDUCTOR DEVICE

(71) Applicant: RENESAS ELECTRONICS CORPORATION, Tokyo (JP)

(72) Inventor: Atsushi Amo, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 16/282,864

(22) Filed: Feb. 22, 2019

(65) Prior Publication Data
US 2019/0280096 A1 Sep. 12, 2019

(30) Foreign Application Priority Data
Mar. 7, 2018 (JP) ................. 2018-040612

(51) Int. Cl.
| | | |
|---|---|---|
| H01L 29/423 | (2006.01) | |
| H01L 21/28 | (2006.01) | |
| H01L 27/11568 | (2017.01) | |
| H01L 27/11573 | (2017.01) | |
| H01L 29/792 | (2006.01) | |

(Continued)

(52) U.S. Cl.
CPC ........ *H01L 29/42344* (2013.01); *H01L 21/28* (2013.01); *H01L 21/28158* (2013.01); *H01L 27/11565* (2013.01); *H01L 27/11568* (2013.01); *H01L 27/11573* (2013.01); *H01L 29/40117* (2019.08); *H01L 29/423* (2013.01); *H01L 29/51* (2013.01); *H01L 29/792* (2013.01)

(58) Field of Classification Search
CPC . H01L 29/42344; H01L 29/792; H01L 29/51; H01L 27/11565; H01L 21/28; H01L 29/423; H01L 29/40117; H01L 21/28158; H01L 27/11568; H01L 27/11573
USPC ......................................... 257/324
See application file for complete search history.

(56) References Cited

U.S. PATENT DOCUMENTS

| | | | |
|---|---|---|---|
| 9,257,446 B2 | 2/2016 | Arigane et al. | |
| 2007/0141780 A1* | 6/2007 | Higashitani | H01L 27/115 438/257 |
| 2015/0060991 A1* | 3/2015 | Mizutani | H01L 29/792 257/324 |

FOREIGN PATENT DOCUMENTS

JP 2015-103698 A 6/2015

OTHER PUBLICATIONS

Partial European Search Report issued in corresponding European Patent Application No. 19155607.5-1212, dated Jan. 17, 2020.

* cited by examiner

*Primary Examiner* — Karen Kusumakar
*Assistant Examiner* — Adam S Bowen
(74) *Attorney, Agent, or Firm* — McDermott Will & Emery LLP

(57) ABSTRACT

A semiconductor device according to one embodiment includes: a semiconductor substrate having a first surface; a first conductive film that is located over the first surface and is formed to circle in plan view; a second conductive film that is located over the first surface and surrounds the outer periphery of the first conductive film in plan view; a first insulating spacer located between the first conductive film and the second conductive film; a first gate insulating film that is located between the first surface and the first conductive film and the accumulated amount of charges of which changes due to a change in the voltage between the first conductive film and the semiconductor substrate; and a (Continued)

second gate insulating film located between the first surface and the second conductive film.

13 Claims, 18 Drawing Sheets

(51) Int. Cl.
*H01L 29/51* (2006.01)
*H01L 27/11565* (2017.01)

SEMICONDUCTOR DEVICE AND MANUFACTURING METHOD OF SEMICONDUCTOR DEVICE

CROSS-REFERENCE TO RELATED APPLICATIONS

The disclosure of Japanese Patent Application No. 2018-040612 filed on Mar. 7, 2018 including the specification, drawings and abstract is incorporated herein by reference in its entirety.

BACKGROUND

The present invention relates to a semiconductor device and a manufacturing method of the semiconductor device.

A semiconductor device described in Patent Document 1 (Japanese Unexamined Patent Application Publication No. 2015-103698) has been known before. The semiconductor device described therein has a semiconductor substrate including a main surface, and a memory gate electrode portion and a control gate electrode portion arranged over the main surface of the semiconductor substrate. The side wall of the memory gate electrode portion and that of the control gate electrode portion are insulated from each other.

The memory gate electrode portion has a first portion and a second portion. The first portion and the second portion extend along a Y direction in a plane parallel to the main surface of the semiconductor substrate. The first portion and the second portion are in a plane parallel to the main surface of the semiconductor substrate and are arranged to be spaced apart from each other in an X direction perpendicular to the Y direction.

The control gate electrode portion has a third portion and a fourth portion. The third portion and the fourth portion extend along the Y direction. The third portion is arranged adjacent to the first portion in the X direction. The fourth portion is arranged adjacent to the second portion in the X direction. The first portion and the second portion are arranged between the third portion and the fourth portion.

In the manufacturing steps of the semiconductor device described in Patent Document 1, the material configuring the control gate electrode portion is firstly formed over the main surface of the semiconductor substrate. Secondly, the material configuring the formed control gate electrode portion is patterned. Thirdly, the material configuring the memory gate electrode portion is formed to cover the material configuring the patterned control gate electrode portion. Fourthly, the material configuring the formed memory gate electrode portion is patterned by etch-back. Fifthly, the material configuring the patterned control gate electrode portion and material configuring the memory gate electrode portion are cut by etching so as to be spaced apart from each other in the X direction.

RELATED ART DOCUMENT

Patent Document

[Patent Document 1] Japanese Unexamined Patent Application Publication No. 2015-103698

SUMMARY

In the manufacturing steps of the semiconductor device described in Patent Document 1, it is not clear how to process the edges in the Y direction, when the material configuring the patterned memory gate electrode portion and that configuring the control gate electrode portion are cut by etching so as to be spaced apart from each other in the X direction.

Other problems and new characteristics will become clear from the description and accompanying drawings of the present specification.

A semiconductor device according to one embodiment includes: a semiconductor substrate having a first surface; a first conductive film that is located over the first surface and is formed to circle in plan view; a second conductive film that is located over the first surface and surrounds the outer periphery of the first conductive film in plan view; a first insulating spacer located between the first conductive film and the second conductive film; a first gate insulating film that is located between the first surface and the first conductive film and the accumulated amount of charges of which changes due to a change in the voltage between the first conductive film and the semiconductor substrate; and a second gate insulating film located between the first surface and the second conductive film.

The first conductive film has a first memory gate portion and a second memory gate portion. In plan view, the first memory gate portion and the second memory gate portion are spaced apart from each other in a first direction, and extend along a second direction perpendicular to the first direction. The second conductive film has a first control gate portion extending along the first memory gate portion and a second control gate portion extending along the second memory gate portion.

The semiconductor substrate has a first drain region located in the first surface, a source region located in the first surface, and a second drain region located in the first surface. The first memory gate portion and the first control gate portion are sandwiched by the first drain region and the source region in plan view. The second memory gate portion and the second control gate portion are sandwiched by the second drain region and the source region in plan view.

According to the semiconductor device of the one embodiment, the withstand voltage between the first conductive film and the second conductive film can be increased.

DETAILED DESCRIPTION

Figure 1:
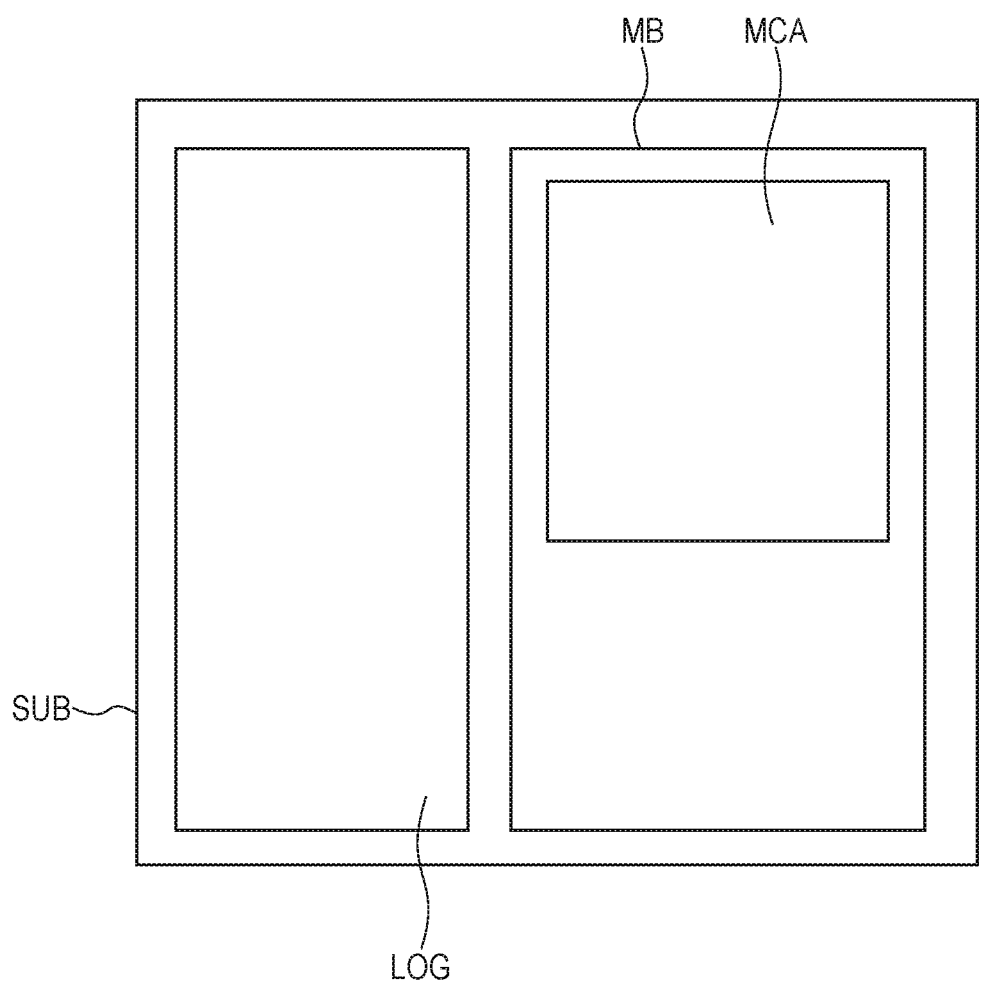
FIG. 1 is a schematic layout view of a semiconductor device according to First Embodiment.

Details of embodiments will be described with reference to the views. In the following views, the same or corresponding parts will be denoted by the same reference numerals and duplicate description will not be repeated.

First Embodiment

Hereinafter, the configuration of a semiconductor device according to First Embodiment will be described.

The semiconductor device according to the embodiment has a memory portion MB and a logic portion LOG, as illustrated in FIG. 1. The memory portion MB includes a memory cell array MCA. Although not illustrated in FIG. 1, the memory portion MB includes, in addition to the memory cell array MCA, a control circuit, an input/output circuit, an address buffer circuit, a row address decoder circuit, a column address decoder circuit, a sense amplifier circuit, a power supply circuit, and the like. The logic portion LOG includes a logic circuit including, for example, a CMOS (Complementary Metal Oxide Semiconductor) circuit. The memory portion MB and the logic portion LOG are formed in a semiconductor substrate SUB.

Figure 2:
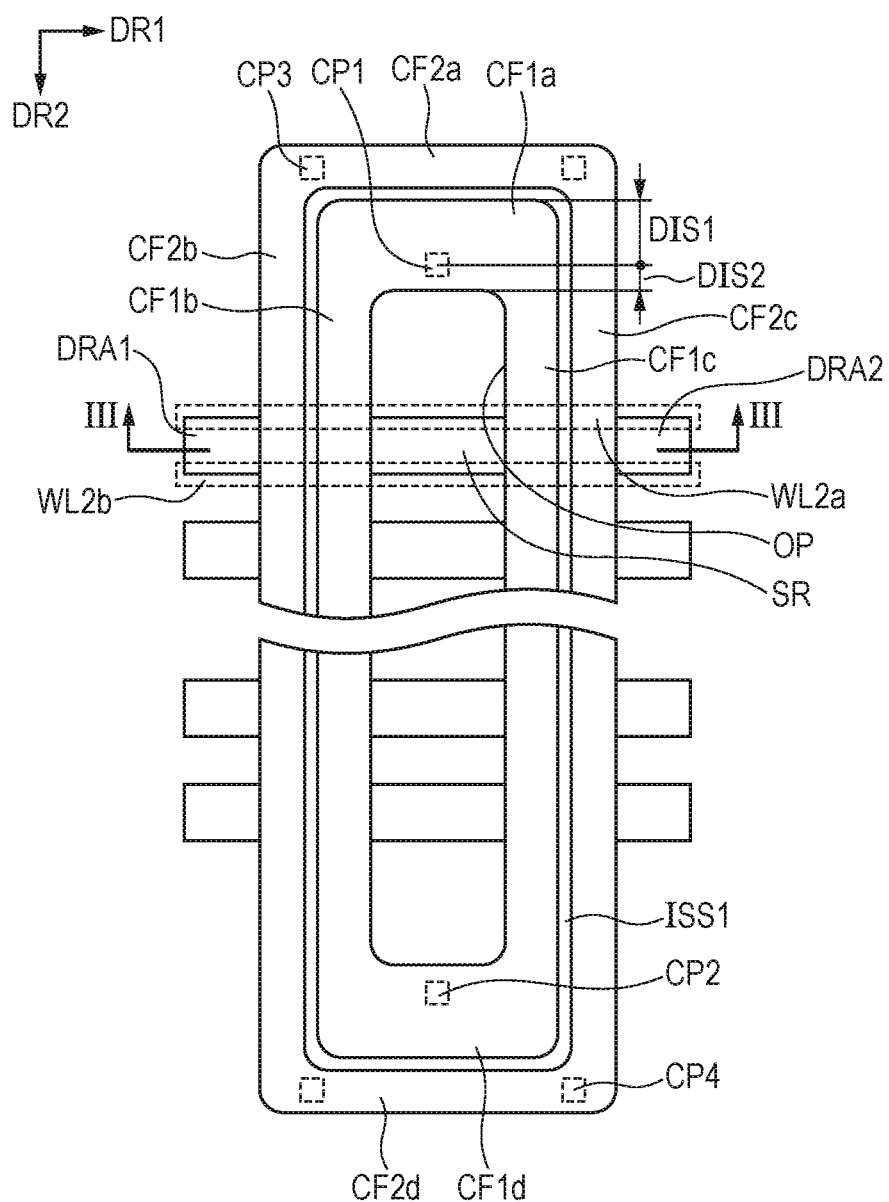
FIG. 2 is an enlarged layout view of a memory cell array MCA of the semiconductor device according to First Embodiment.
Figure 3:
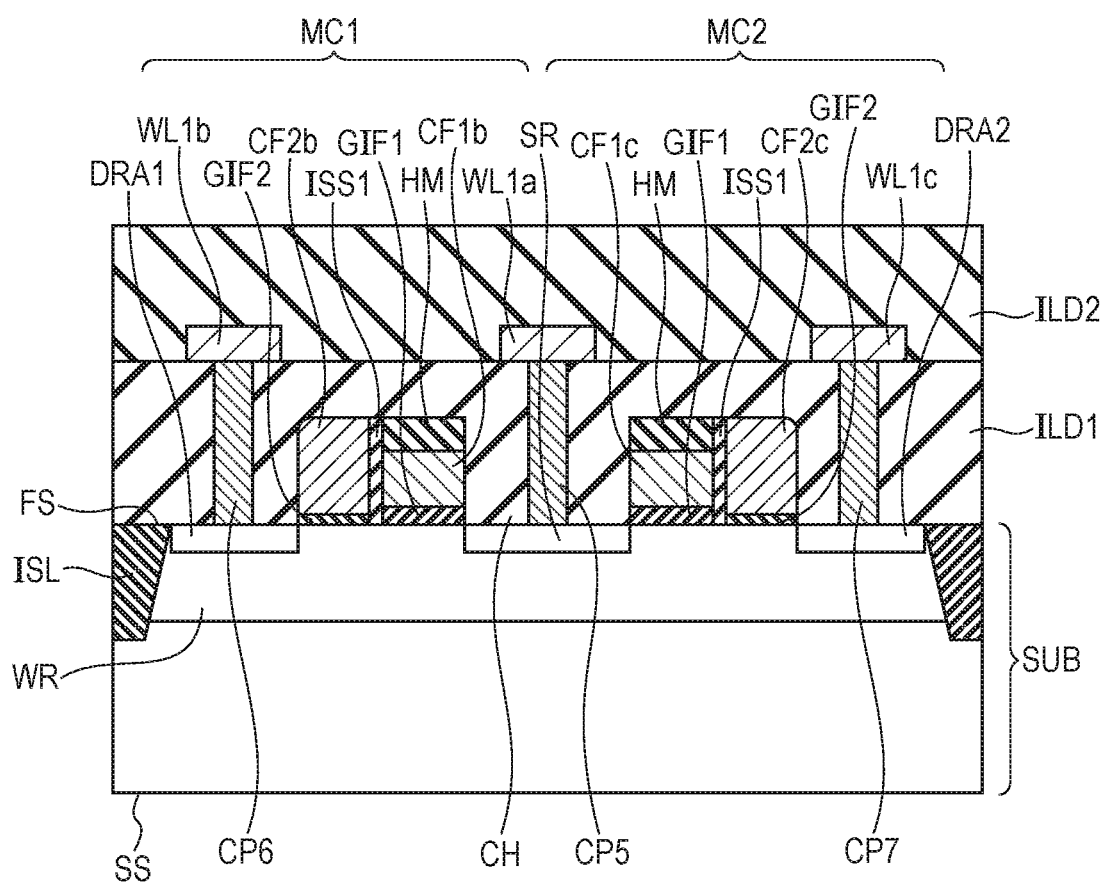
FIG. 3 is a sectional view taken along the line III-III in FIG. 2.

As illustrated in FIG. 2, the semiconductor device according to First Embodiment includes the semiconductor substrate SUB, a first conductive film CF1, a second conductive film CF2, an insulating spacer ISS1, a first gate insulating film GIF1 (see FIG. 3), and a second gate insulating film GIF2 (see FIG. 3). In FIG. 2, a contact plug CP5, a contact plug CP6, and a contact plug CP7 (see FIG. 3) are not illustrated.

The semiconductor substrate SUB has a first surface FS and a second surface SS (see FIG. 3). The second surface SS is a surface opposite to the first surface FS. The first surface FS and the second surface SS configure the main surfaces of the semiconductor substrate SUB. The semiconductor substrate SUB is formed of, for example, a single crystal of silicon (Si).

The first conductive film CF1 is formed of, for example, polycrystalline silicon doped with impurities. The first conductive film CF1 is arranged over the first surface FS. The first conductive film CF1 has a first coupling portion CF1a, a first memory gate portion CF1b, a second memory gate portion CF1c, and a second coupling portion CF1d.

The first coupling portion CF1a extends along a first direction DR1 in plan view (viewed from a direction perpendicular to the first surface FS). The first coupling portion CF1a has a first end and a second end in the first direction DR1. The first end is one end, in the first direction DR1, of the first coupling portion CF1a. The second end is the end opposite to the first end, in the first direction DR1, of the first coupling portion CF1a.

The first memory gate portion CF1b extends along a second direction DR2 perpendicular to the first direction DR1 in plan view. The first memory gate portion CF1b extends from the first end of the first coupling portion CF1a. The second memory gate portion CF1c extends along the second direction DR2. The second memory gate portion CF1c extends from the second end of the first coupling portion CF1a. That is, the first memory gate portion CF1b and the second memory gate portion CF1c are spaced apart from each other in the first direction DR1.

The second coupling portion CF1d couples the end of the first memory gate portion CF1b, opposite to the end on the first coupling portion CF1a side, and the end of the second memory gate portion CF1c, opposite to the end on the first coupling portion CF1a side. That is, the first conductive film CF1 is formed to circle in plan view. From another point of view, this means that the first conductive film CF1 is not cut in the middle. The second coupling portion CF1d extends along the first direction DR1.

The outer periphery of the first conductive film CF1 has a first rectangular shape in plan view. The "rectangular shape" also includes a rounded rectangle with rounded corners. The first rectangular shape has a side parallel to the first direction DR1 and a side parallel to the second direction DR2. The first conductive film CF1 has an opening OP. The opening OP penetrates through the first conductive film CF1 in the thickness direction. The opening OP has a second rectangular shape in plan view. The second rectangular shape has a side parallel to the first direction DR1 and a side parallel to the second direction DR2. The opening OP is located inside the first rectangular shape in plan view. The first coupling portion CF1a, the first memory gate portion CF1b, the second memory gate portion CF1c, and the second coupling portion CF1d are defined by the edge of the opening OP and the outer periphery of the first conductive film CF1.

The second conductive film CF2 is formed of, for example, polycrystalline silicon doped with impurities. The second conductive film CF2 is arranged over the first surface FS. The second conductive film CF2 surrounds the outer periphery of the first conductive film CF1 in plan view. The second conductive film CF2 has a third coupling portion CF2a, a first control gate portion CF2b, a second control gate portion CF2c, and a fourth coupling portion CF2d.

The third coupling portion CF2a extends along the first direction DR1. The third coupling portion CF2a has a third end and a fourth end in the first direction DR1. The third end is one end, in the first direction DR1, of the third coupling portion CF2a. The fourth end is the end of the third coupling portion CF2a, opposite to the third end in the first direction DR1. The third coupling portion CF2a extends along the first coupling portion CF1a.

The first control gate portion CF2b extends along the second direction DR2. The first control gate portion CF2b extends from the third end of the third coupling portion CF2a. The first control gate portion CF2b extends along the first memory gate portion CF1b.

The second control gate portion CF2c extends along the second direction DR2. The second control gate portion CF2c extends from the fourth end of the third coupling portion CF2a. The second control gate portion CF2c extends along the second memory gate portion CF1c.

The fourth coupling portion CF2d couples the end of the first control gate portion CF2b, opposite to the end on the third coupling portion CF2a side, and the end of the second control gate portion CF2c, opposite to the end on the third coupling portion CF2a side. That is, the second conductive film CF2 is not cut in the middle. The fourth coupling portion CF2d extends along the first direction DR1.

The insulating spacer ISS1 includes an insulator. For example, silicon oxide ($SiO_2$), silicon nitride (SiN), or the like is used for the insulating spacer ISS1. The insulating spacer ISS1 is located between the first conductive film CF1 and the second conductive film CF2 in plan view. More specifically, the insulating spacer ISS1 is arranged between the side wall on the outer peripheral side of the first conductive film CF1 and the side wall on the inner peripheral side of the second conductive film CF2.

The semiconductor substrate SUB has a first drain region DRA1, a source region SR, a second drain region DRA2, and a well region WR, as illustrated in FIG. 3. Although not illustrated in FIG. 2, an active region, including the first drain region DRA1, the source region SR, the second drain region DRA2, the well region WR between the first drain region DRA1 and the source region SR, and a well region between the second drain region DRA2 and the source region SR, is insulated and isolated by an element isolation film ISL in plan view. The element isolation film ISL is, for example, STI (Shallow Trench Isolation) including silicon oxide.

The first drain region DRA1, the source region SR, and the second drain region DRA2 are of a first conductivity type, and the well region WR is of a second conductivity type. The second conductivity type is a conductivity type opposite to the first conductivity type. The first conductivity type is, for example, an n-type. The second conductivity type is, for example, a p-type. The first drain region DRA1, the source region SR, and the second drain region DRA2 are doped with a donor element such as, for example, phosphorus (P) or arsenic (As). The well region WR is doped with an acceptor element such as, for example, boron (B) or aluminum (Al).

The first drain region DRA1, the source region SR, and the second drain region DRA2 are arranged in the first surface FS. The first drain region DRA1, the source region SR, and the second drain region DRA2 are arranged to be spaced apart from each other in the first direction DR1. The well region WR is arranged in the first surface FS so as to surround the first drain region DRA1, the source region SR, and the second drain region DRA2.

More specifically, the first drain region DRA1 is arranged to sandwich, in the first direction DR1, the first memory gate portion CF1b and the first control gate portion CF2b with the source region SR. The second drain region DRA2 is arranged to sandwich, in the first direction DR1, the second memory gate portion CF1c and the second control gate portion CF2c with the source region SR.

The first gate insulating film GIF1 is located between the first conductive film CF1 and the first surface FS. As the voltage between the first conductive film CF1 and the semiconductor substrate SUB changes, the accumulated amount of charges in the first gate insulating film GIF1 changes. The first gate insulating film GIF1 is preferably thicker than the second gate insulating film GIF2.

The first gate insulating film GIF1 has, for example, a first layer, a second layer, a third layer, and a fourth layer. The first layer is arranged directly over the first surface FS. The first layer includes silicon oxide. The second layer is arranged over the first layer. The second layer includes aluminum oxide (AlO).

The third layer is arranged over the second layer. The third layer includes hafnium silicate (HfSiO). The fourth layer is arranged over the third layer. The fourth layer includes aluminum oxide. That is, the first gate insulating film GIF1 may be an AHAO (Aluminum Hafnium Aluminum Oxide) film.

However, the first gate insulating film GIF1 is not limited to an AHAO film. The first gate insulating film GIF1 may include, for example, an ONO (Oxide Nitride Oxide) film including a first silicon oxide film arranged directly over the first surface FS, a silicon nitride film arranged over the first silicon oxide film, and a second silicon oxide film arranged over the silicon nitride film.

The second gate insulating film GIF2 includes, for example, silicon oxide. The second gate insulating film GIF2 is arranged between the first surface FS and the second conductive film CF2.

The first drain region DRA1, the source region SR, the well region WR, the first gate insulating film GIF1, the second gate insulating film GIF2, the first memory gate portion CF1b, and the first control gate portion CF2b configure a split gate type flash memory cell MC1. Similarly, the second drain region DRA2, the source region SR, the well region WR, the first gate insulating film GIF1, the second gate insulating film GIF2, the second memory gate portion CF1c, and the second control gate portion CF2c configure a split gate type flash memory cell MC2.

The semiconductor device according to First Embodiment further includes a hard mask HM. The hard mask HM includes an insulator. For example, silicon oxide or silicon nitride is used for the hard mask HM. The hard mask HM is arranged over the upper surface of the first conductive film CF1.

The semiconductor device according to First Embodiment further includes an interlayer insulating film ILD1, an interlayer insulating film ILD2, a contact plug CP1, a contact plug CP2, a contact plug CP3, a contact plug CP4, a contact plug CP5, a contact plug CP6, a contact plug CP7, wiring WL1a, wiring WL1b, wiring WL1c, wiring WL2a (first bit line), and wiring WL2b (second bit line).

The interlayer insulating film ILD1 is arranged over the first surface FS. The interlayer insulating film ILD1 includes, for example, silicon oxide. A contact hole CH is provided in the interlayer insulating film ILD1. The contact hole CH penetrates through the interlayer insulating film ILD1 in the thickness direction.

The contact plug CP1 to the contact plug CP7 include, for example, tungsten (W) or the like. The contact plug CP1 to the contact plug CP7 are arranged in the interlayer insulating film ILD1. More specifically, each of the contact plug CP1 to the contact plug CP7 is buried in the contact hole CH.

The contact plug CP1 is electrically coupled to the first coupling portion CF1a, as illustrated in FIG. 2. The contact plug CP2 is electrically coupled to the second coupling portion CF1d. That is, the first coupling portion CF1a and the second coupling portion CF1d serve as a shunt region of the first conductive film CF1.

A distance DIS1 between the contact plug CP1 (contact plug CP2) and one end, in the second direction DR2, of the first coupling portion CF1a (second coupling portion CF1d) is larger than a distance DIS2 between the contact plug CP1 (contact plug CP2) and the other end, in the second direction DR2, of the first coupling portion CF1a (second coupling portion CF1d). The one end, in the second direction DR2, of the first coupling portion CF1a (second coupling portion CF1d) is the end on the third coupling portion CF2a (fourth coupling portion CF2d) side.

A distance between the contact plug CP3 (contact plug CP4) and one end, in the second direction DR2, of the third coupling portion CF2a (fourth coupling portion CF2d) may be smaller than the distance DIS1. The one end, in the second direction DR2, of the third coupling portion CF2a (fourth coupling portion CF2d) is the end on the first coupling portion CF1a (second coupling portion CF1d) side. This is because: the voltage to be applied to the second conductive film CF2 during operation is usually lower than the voltage to be applied to the first conductive film CF1 during operation; and a short circuit between the contact plug CP3 (contact plug CP4) and the first conductive film CF1 is relatively unlikely to occur.

Although the hard mask HM over the first coupling portion CF1a is partially removed for the coupling to the contact plug CP1 (contact plug CP2), the hard mask HM on the one end side of the contact plug CP1 (contact plug CP2) remains.

The contact plug CP3 is electrically coupled to the third coupling portion CF2a. The contact plug CP4 is electrically coupled to the fourth coupling portion CF2d. That is, the third coupling portion CF2a and the fourth coupling portion CF2d serve as a shunt region of the second conductive film CF2.

The wiring WL1a to the wiring WL1c are arranged over the interlayer insulating film ILD1. The wiring WL1a to the wiring WL1c include, for example, aluminum, an aluminum alloy, copper (Cu), a copper alloy, or the like. The wiring WL1a is electrically coupled to the source region SR via the contact plug CP5.

The interlayer insulating film ILD2 is arranged over the interlayer insulating film ILD1 so as to cover the wiring WL1a to the wiring WL1c. The interlayer insulating film ILD2 includes, for example, silicon oxide. A via hole (not illustrated) is provided in the interlayer insulating film ILD2. The via hole penetrates through the interlayer insulating film ILD2 in the thickness direction. A via plug (not illustrated) is buried in the via hole.

The wiring WL2a and the wiring WL2b are arranged over the interlayer insulating film ILD2. The wiring WL2a and the wiring WL2b include, for example, aluminum, an aluminum alloy, copper, a copper alloy, or the like.

The wiring WL2a and the wiring WL2b extend along the first direction DR1. The wiring WL2a is electrically coupled to the first drain region DRA1 via the via plug (not illustrated), the wiring WL1b, and the contact plug CP6. The wiring WL2b is electrically coupled to the second drain region DRA2 via the via plug, the wiring WL1c, and the contact plug CP7.

Figure 4:
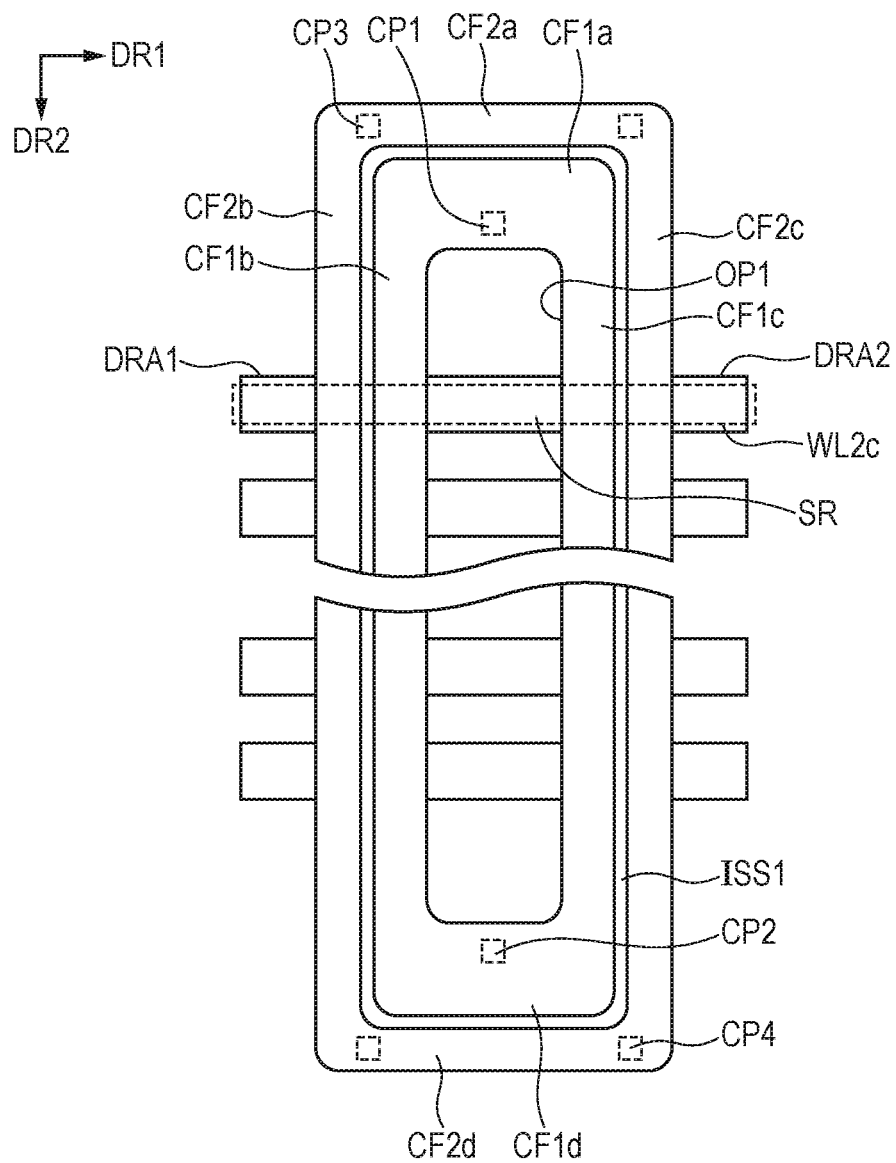
FIG. 4 is an enlarged layout view of a memory cell array MCA of a semiconductor device according to a variation of First Embodiment.

The semiconductor device according to First Embodiment may have wiring WL2c instead of the wiring WL2a and the wiring WL2b, as illustrated in FIG. 4. The wiring WL2c extends along the first direction DR1. The wiring WL2c is coupled to the first drain region DRA1 via the via plug, the wiring WL1b, and the contact plug CP6, and is electrically coupled to the second drain region DRA2 via the via plug, the wiring WL1c, and the contact plug CP7.

The memory cell array MCA can be configured by repeatedly arranging the structure illustrated in FIG. 2 in the first direction DR1 and the second direction DR2.

Figure 5:
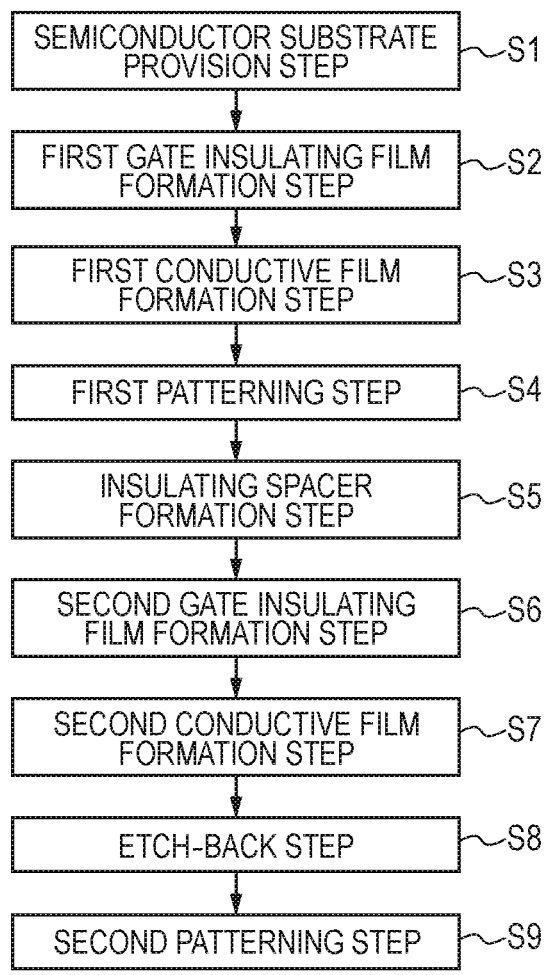
FIG. 5 is a step chart showing a manufacturing method of the semiconductor device according to First Embodiment.

Hereinafter, a manufacturing method of the semiconductor device according to First Embodiment will be described. A manufacturing method of the semiconductor device according to First Embodiment includes a semiconductor substrate provision step S1, a first gate insulating film formation step S2, a first conductive film formation step S3, a first patterning step S4, an insulating spacer formation step S5, a second gate insulating film formation step S6, a second conductive film formation step S7, an etch-back step S8, and a second patterning step S9, as shown in FIG. 5.

In the manufacturing method of the semiconductor device according to First Embodiment, after the second patterning step S9 is performed, a step of forming the first drain region DRA1, the source region SR, and the second drain region DRA2, a step of forming the insulating film ILD1, a step of forming the contact plug CP1 to the contact plug CP7, a step of forming the wiring WL1a to the wiring WL1c, a step of forming the interlayer insulating film ILD2, and a step of forming the wiring WL2a and the wiring WL2c are performed. However, these steps are performed in accordance with a conventionally known method, and hence detailed description will be omitted.

Figure 6:
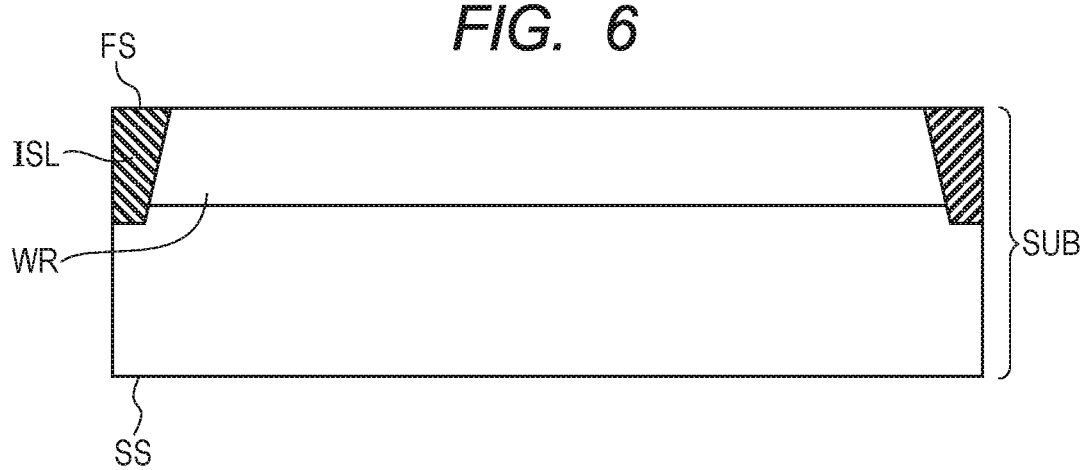
FIG. 6 is a sectional view of the semiconductor device according to First Embodiment in a semiconductor substrate provision step S1.

In the semiconductor substrate provision step S1, the semiconductor substrate SUB is provided as illustrated in FIG. 6. At the time, the element isolation film ISL and the well region WR are formed in the semiconductor substrate SUB. The element isolation film ISL is formed by forming a trench in the first face FS with anisotropic etching such as RIE (Reactive Ion Etching) and by burying the material configuring the element isolation film ISL in the trench. The well region WR is formed by performing ion implantation on the semiconductor substrate SUB after the element isolation film ISL is formed.

Figure 7:
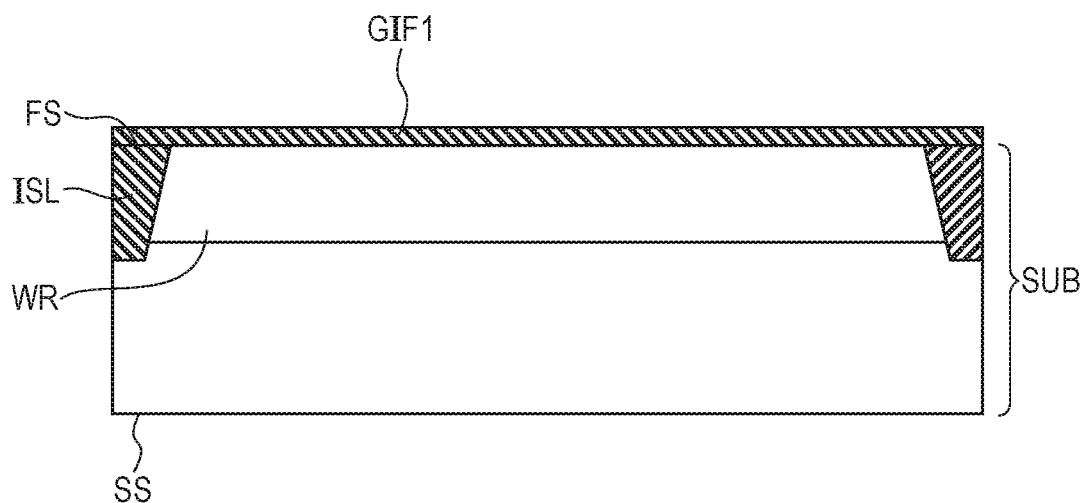
FIG. 7 is a sectional view of the semiconductor device according to First Embodiment in a first gate insulating film formation step S2.

In the first gate insulating film formation step S2, the first gate insulating film GIF1 is formed as illustrated in FIG. 7. The first gate insulating film GIF1 is formed by, for example, CVD (Chemical Vapor Deposition).

Figure 8:
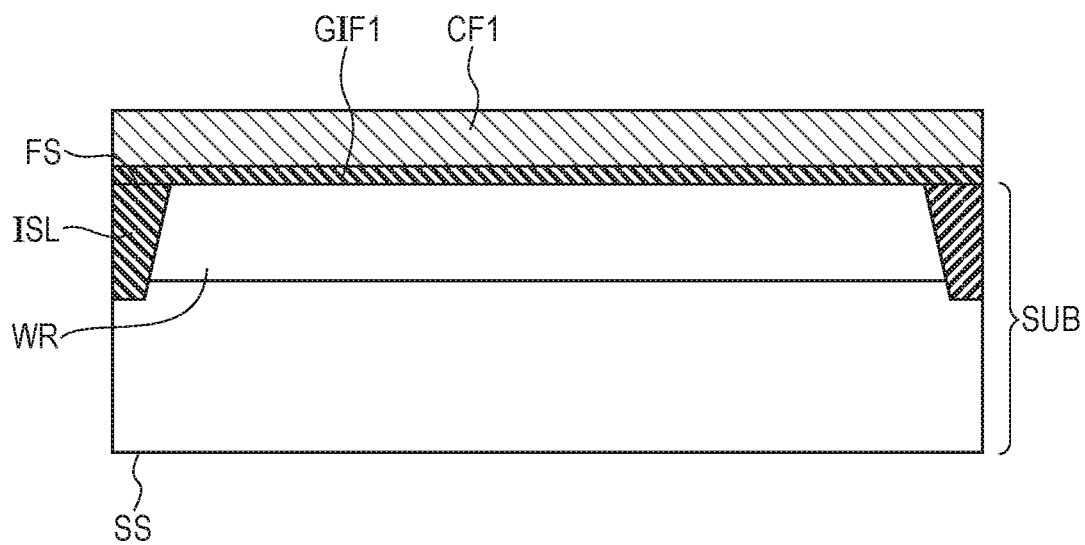
FIG. 8 is a sectional view of the semiconductor device according to First Embodiment in a first conductive film formation step S3.

In the first conductive film formation step S3, the first conductive film CF1 is formed as illustrated in FIG. 8. The first conductive film CF1 is formed by, for example, CVD.

The first patterning step S4 has a hard mask formation step S41, a hard mask patterning step S42, and an etching step S43.

Figure 9:
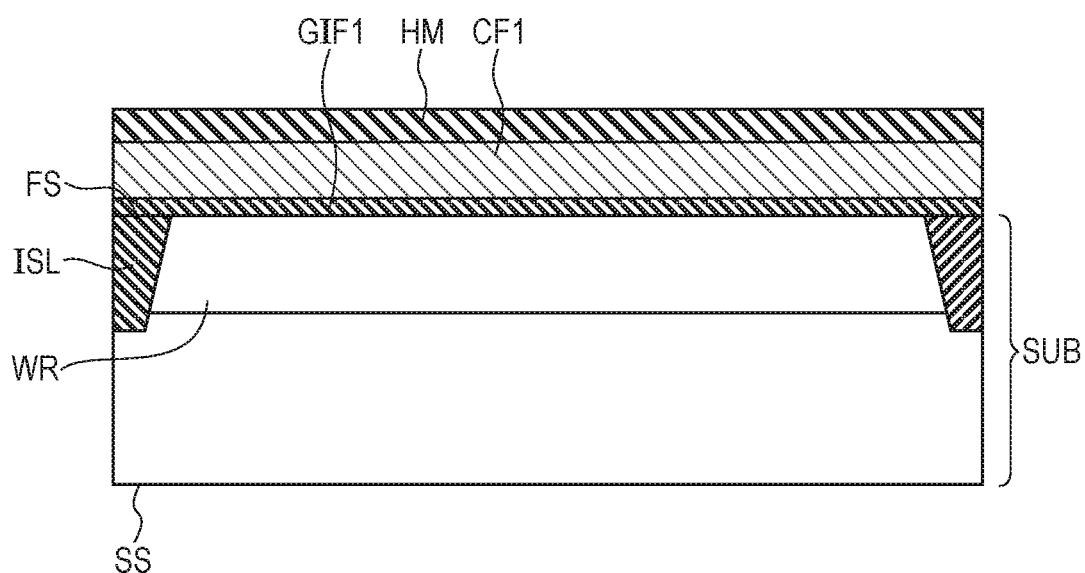
FIG. 9 is a sectional view of the semiconductor device according to First Embodiment in a hard mask formation step S41.

In the hard mask formation step S41, the material configuring the hard mask HM is formed over the first conductive film CF1, as illustrated in FIG. 9. The material configuring the hard mask HM is formed by, for example, CVD.

Figure 10:
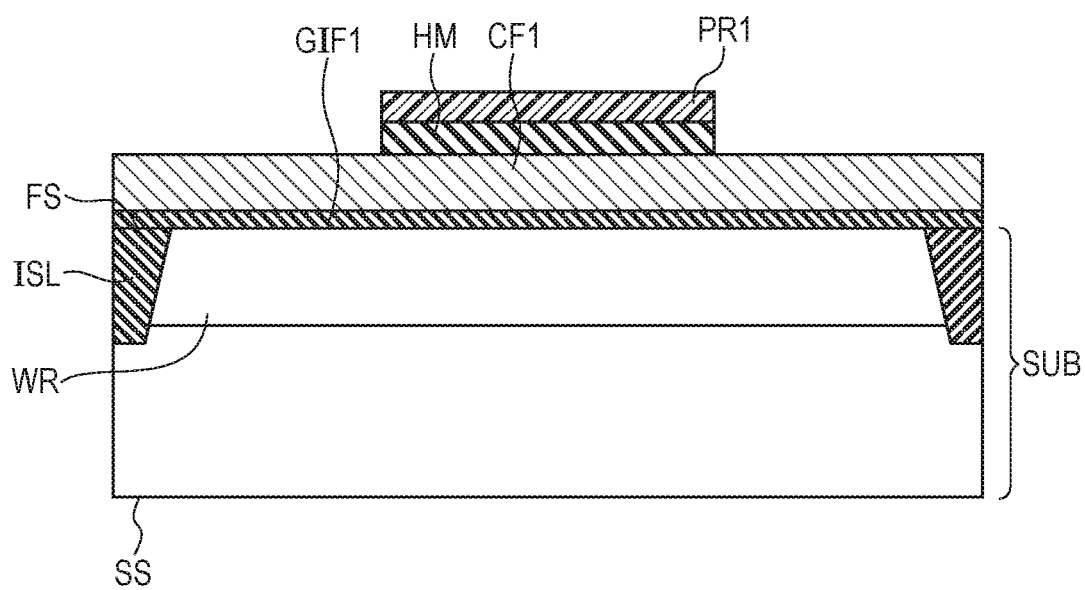
FIG. 10 is a sectional view of the semiconductor device according to First Embodiment in a hard mask patterning step S42.

In the hard mask patterning step S42, the material configuring the formed hard mask HM is patterned as illustrated in FIG. 10. This patterning is performed by patterning a photoresist PR1 formed over the material configuring the hard mask HM with photolithography and by etching the material configuring the hard mask HM with the use of the photoresist PR1 as a mask.

Figure 11:
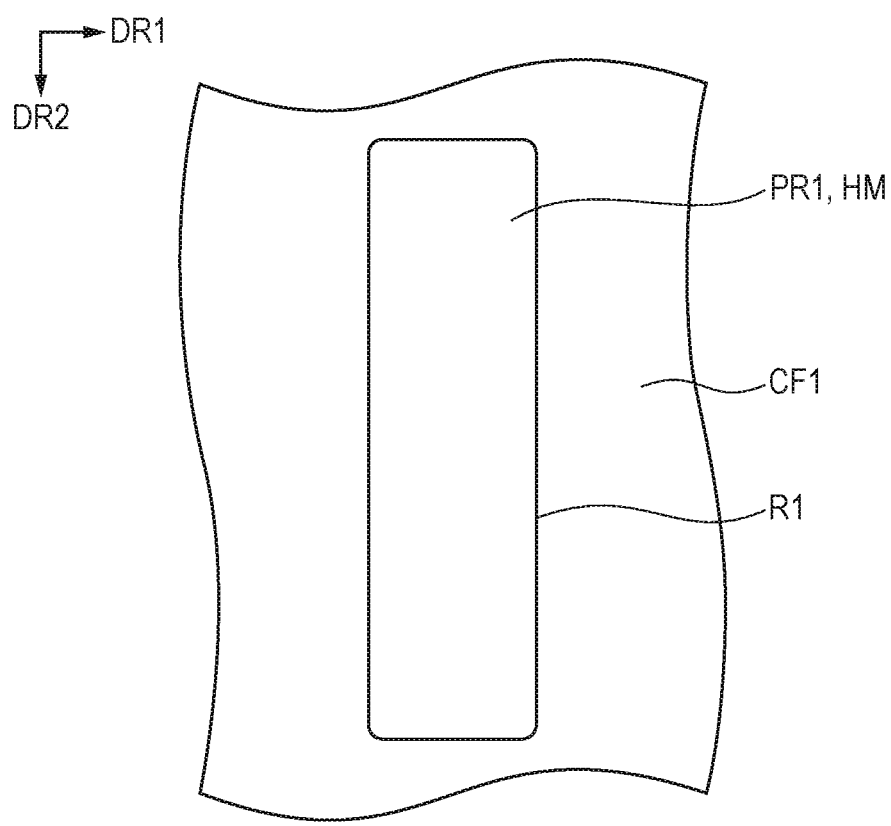
FIG. 11 is a top view of the semiconductor device according to First Embodiment in a hard mask patterning step S42.

The hard mask HM (and photoresist PR1) is patterned to cover the first region R1, as illustrated in FIG. 11. The first region R1 has a first rectangular shape in plan view. That is, the first region R1 has a side parallel to the first direction DR1 and a side parallel to the second direction DR2.

Figure 12:
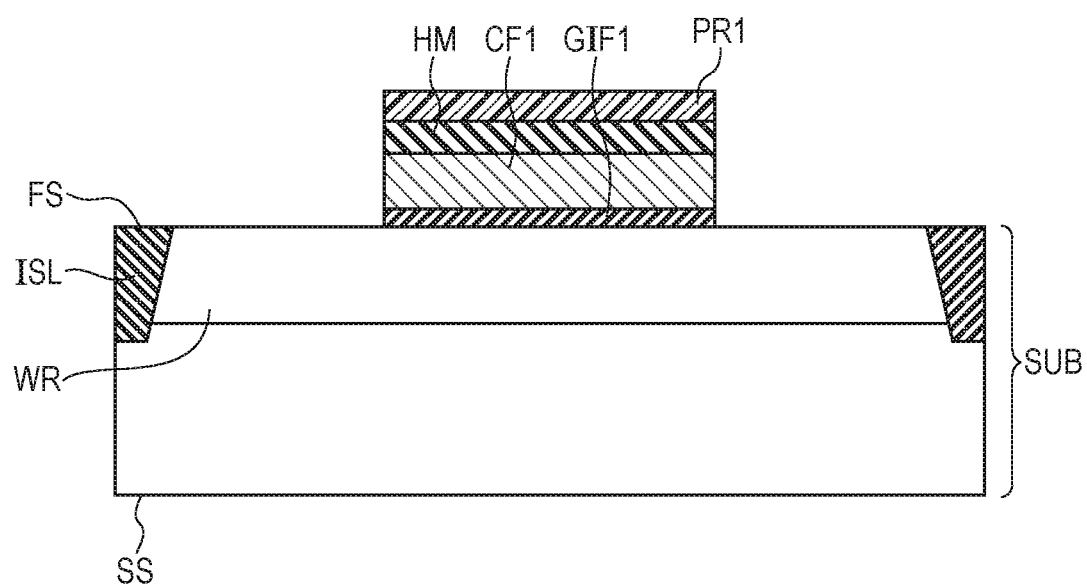
FIG. 12 is a sectional view of the semiconductor device according to First Embodiment in an etching step S43.

In the etching step S43, the first conductive film CF1 is etched by using the hard mask HM and the photoresist PR1 as a mask, as illustrated in FIG. 12. This etching is performed by, for example, anisotropic etching such as RIE. As a result of the etching step S43, the first conductive film CF1 is patterned to have the first rectangular shape in plan view (first patterning).

After the etching step S43 is performed, the photoresist PR1 is removed by ashing, but the hard mask HM remains.

Figure 13:
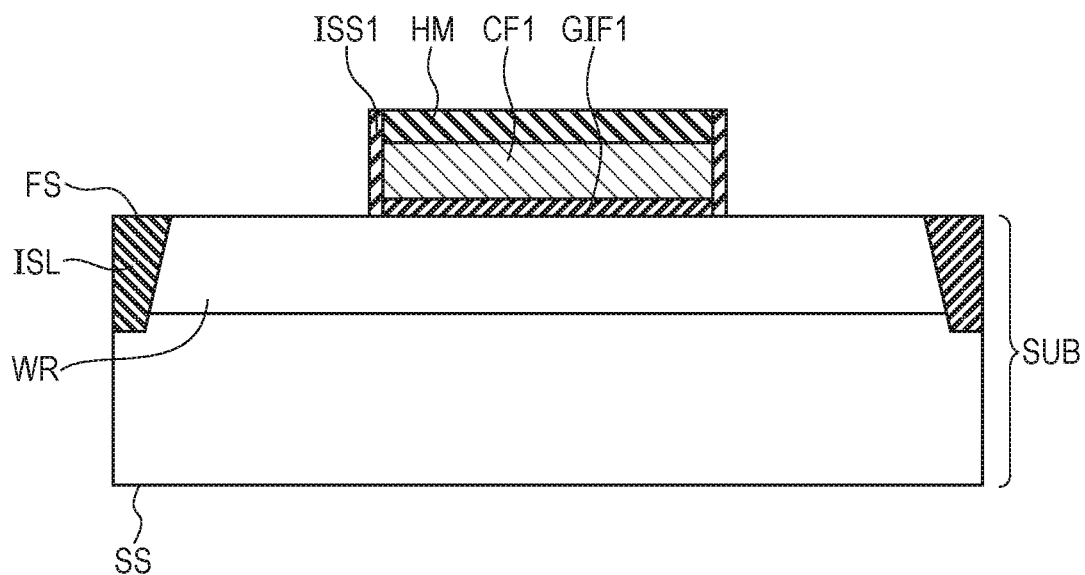
FIG. 13 is a sectional view of the semiconductor device according to First Embodiment in an insulating spacer formation step S5.

In the insulating spacer formation step S5, the insulating spacer ISS1 is formed over the side wall of the first conductive film CF1, as illustrated in FIG. 13. In the insulating spacer formation step S5, the material configuring the insulating spacer ISS1 is firstly formed to cover the first conductive film CF1.

In the insulating spacer formation step S5, etch-back of the material configuring the formed insulating spacer ISS1 is secondly performed. This etch-back is performed until the upper surface of the first conductive film CF1 is exposed. As a result, the insulating spacer ISS 1 is formed over the side wall of the first conductive film CF1.

Figure 14:
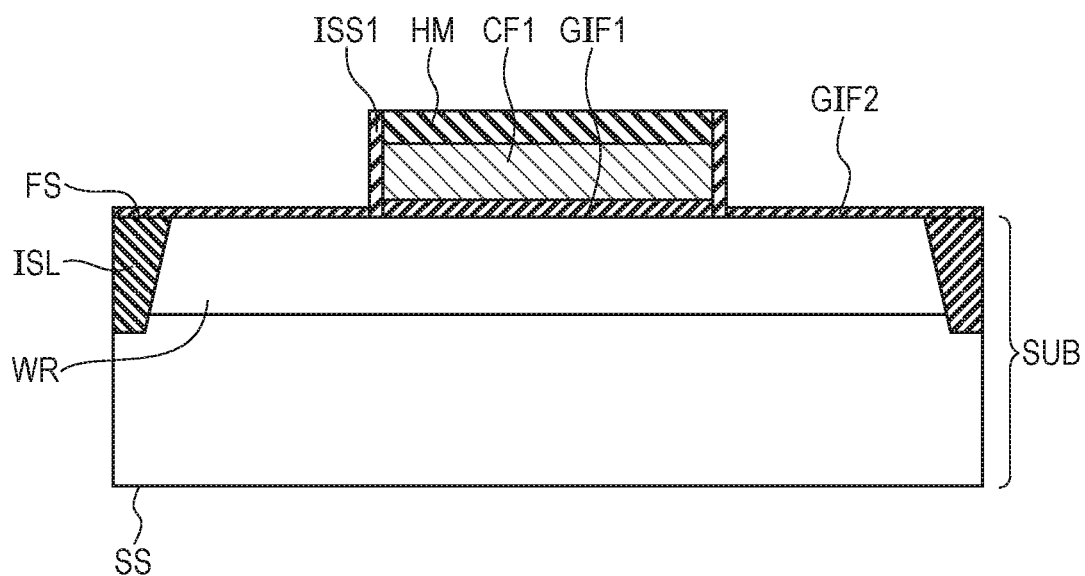
FIG. 14 is a sectional view of the semiconductor device according to First Embodiment in a second gate insulating film formation step S6.

In the second gate insulating film formation step S6, the second gate insulating film GIF2 is formed over the first surface FS, as illustrated in FIG. 14. The second gate insulating film GIF2 is formed by, for example, thermally oxidizing the first surface FS.

Figure 15:
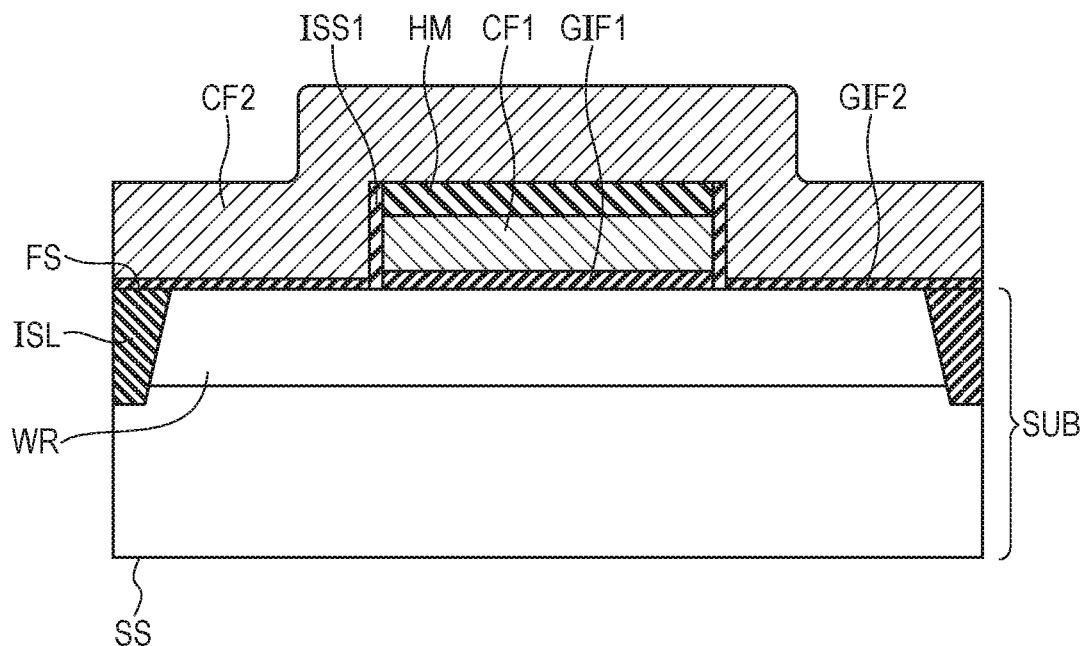
FIG. 15 is a sectional view of the semiconductor device according to First Embodiment in a second conductive film formation step S7.

In the second conductive film formation step S7, the second conductive film CF2 is formed as illustrated in FIG. 15. The second conductive film CF2 is formed to cover the first conductive film CF1 and the insulating spacer ISS1. The second conductive film CF2 is formed by, for example, CVD.

Figure 16:
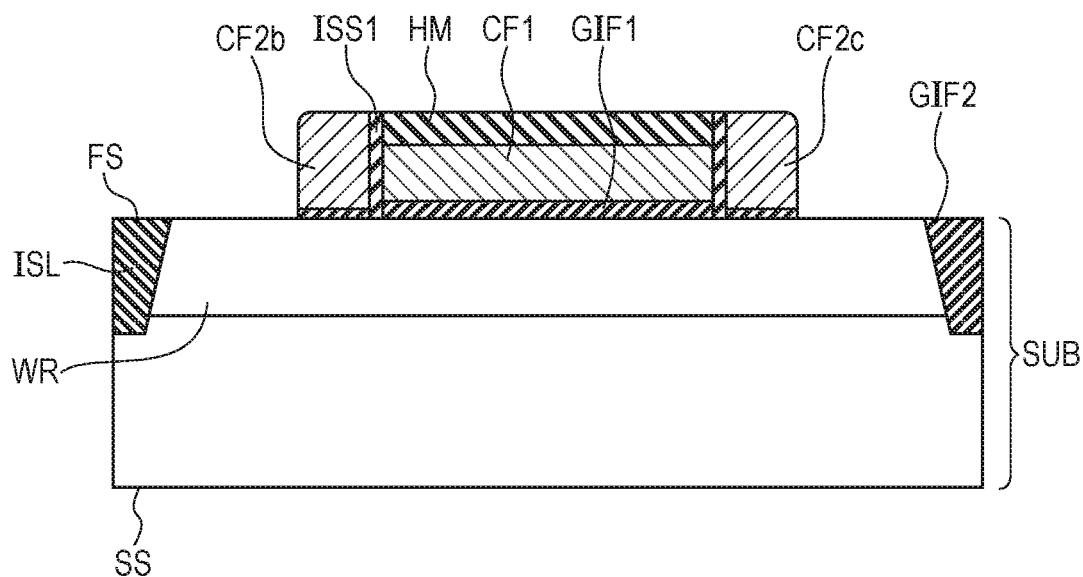
FIG. 16 is a sectional view of the semiconductor device according to First Embodiment in an etch-back step S8.

In the etch-back step S8, the etch-back of the formed second conductive film CF2 is performed as illustrated in FIG. 16. This etch-back is performed until the upper surface of the first conductive film CF1 is exposed. As a result, the second conductive film CF2 remains to surround the outer periphery of the first conductive film CF1 in plan view. That is, as a result of the etch-back step S8, the second conductive film CF2 remains to have the third coupling portion CF2a, the first control gate portion CF2b, the second control gate portion CF2c, and the fourth coupling portion CF2d.

Figure 17:
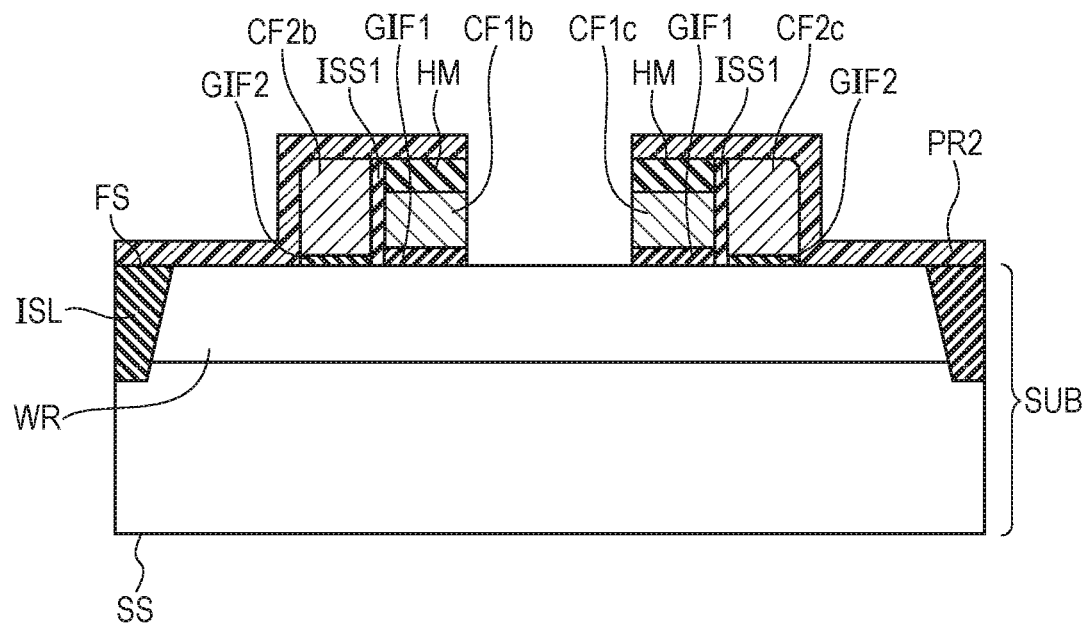
FIG. 17 is a sectional view of the semiconductor device according to First Embodiment in a second patterning step S9.

In the second patterning step S9, the patterning of the first conductive film CF1 is performed (second patterning), as illustrated in FIG. 17. In the second patterning step S9, a photoresist PR2 is firstly formed over the first conductive film CF1. In the second patterning step S9, the photoresist PR2 is secondly patterned by photolithography.

Figure 18:
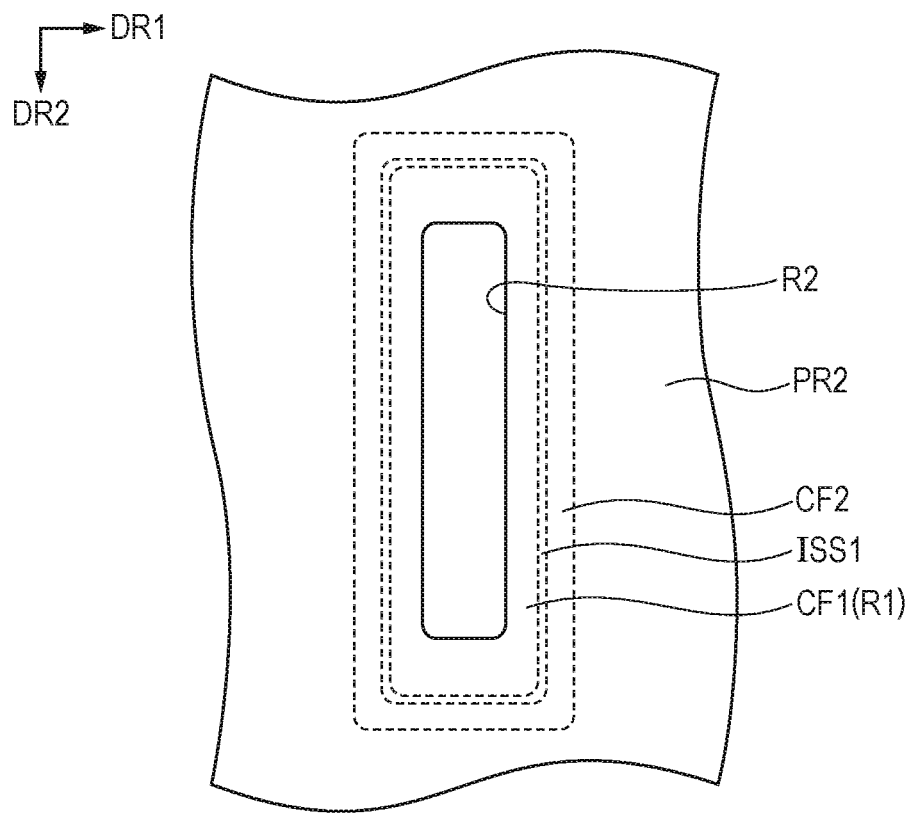
FIG. 18 is a top view of the semiconductor device according to First Embodiment in the second patterning step S9.

An opening is provided in a second region R2 of the photoresist PR2, as illustrated in FIG. 18. The second region R2 has a second rectangular shape in plan view. That is, the second region R2 has a side parallel to the first direction DR1 and a side parallel to the second direction DR2. The second region R2 is located inside the first region R1 in plan view.

In the second patterning step S9, the first conductive film CF1 is thirdly etched by using the photoresist PR2 having an opening in the second region R2 as a mask. This etching is performed by, for example, anisotropic etching such as RIE. As a result, the first conductive film CF1 remains to have the first coupling portion CF1a, the first memory gate portion CF1b, the second memory gate portion CF1c, and the second coupling portion CF1d.

Figure 19:
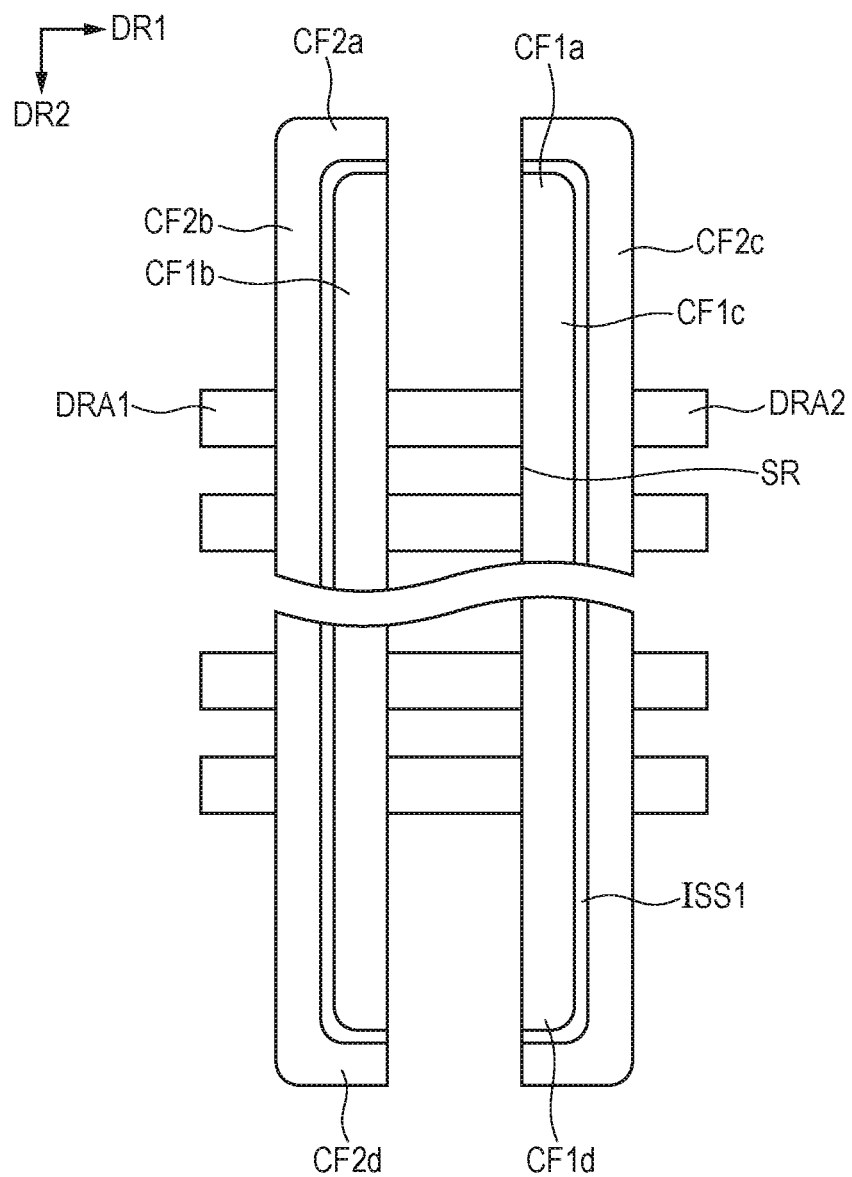
FIG. 19 is an enlarged layout view of a memory cell array MCA of a semiconductor device according to a comparative example.

Hereinafter, the advantages of the semiconductor device according to First Embodiment will be described in comparison with a comparative example. A semiconductor device according to a comparative example is the same as the semiconductor device according to First Embodiment in that the former includes the first conductive film CF1 and the second conductive film CF2, as illustrated in FIG. 19. However, the semiconductor device according to the comparative example is different from the semiconductor device according to First Embodiment in that the first coupling portion CF1a, the second coupling portion CF1d, the third coupling portion CF2a, and the fourth coupling portion CF2d are cut in the middle.

In the semiconductor device according to the comparative example, the distance between the first conductive film CF1 and the second conductive film CF2 is small at the cut positions. As a result, there is the fear in the semiconductor device according to the comparative example that the withstand voltage between the first conductive film CF1 and the second conductive film CF2 may be insufficient.

On the other hand, in the semiconductor device according to First Embodiment, a cut position as described above never exists, and hence the withstand voltage between the first conductive film CF1 and the second conductive film CF2 can be increased.

In the semiconductor device according to First Embodiment, when the hard mask HM is arranged over the upper surface of the first conductive film CF1, the withstand voltage between the upper surface of the first conductive film CF1 and that of the second conductive film CF2 can be increased by the hard mask HM.

An AHAO film has a higher dielectric constant than, for example, an ONO film. Therefore, the voltage to be applied to the first conductive film CF1 can be lowered. When the voltage to be applied to the first conductive film CF1 is lowered, the withstand voltage between the first conductive film CF1 and the second conductive film CF2 is easy to secure even if the thickness of the insulating spacer ISS1 is reduced.

Therefore, when the first gate insulating film GIF1 is an AHAO film in the semiconductor device according to First Embodiment, the cell area of the flash memory cell can be reduced. Also, in this case, the space between the first memory gate portion CF1b and the first control gate portion CF2b (the space between the second memory gate portion CF1c and the second control gate portion CF2c) can be reduced by reducing the thickness of the insulating spacer ISS1, and hence the current drive capability of the flash memory cell can be improved.

In the semiconductor device according to First Embodiment, the first memory gate portion CF1b and the second memory gate portion CF1c are coupled to each other, and hence the potential of the first memory gate portion CF1b and that of the second memory gate portion CF1c are equal to each other. Similarly, the first control gate portion CF2b and the second control gate portion CF2c are coupled to each other, and hence the potential of the first control gate portion CF2b and that of the second control gate portion CF2c are equal to each other.

When the semiconductor device according to First Embodiment has the wiring WL2a and the wiring WL2b, the flash memory cell MC1 and the flash memory cell MC2 can be operated independently of each other.

On the other hand, when the semiconductor device according to First Embodiment has the wiring WL2c instead of the wiring WL2a and the wiring WL2b, the flash memory cell MC1 and the flash memory cell MC2 cannot be operated independently of each other.

In this case, however, the flash memory cell MC1 and the flash memory cell MC2 operate integrally, and hence the accumulated amount of charges in the first gate insulating film GIF1 is doubled. As a result, the data retention characteristic of the flash memory cell can be improved.

Hereinafter, the advantages of the manufacturing method of the semiconductor device according to First Embodiment will be described. The semiconductor device according to First Embodiment can also be formed, for example, by forming the first conductive film CF1 to have the first coupling portion CF1a, the first memory gate portion CF1b, the second memory gate portion CF1c, and the second coupling portion CF1d with single patterning and by etching back the second conductive film CF2 formed to cover the first conductive film CF1.

In this case, however, when the second conductive film CF2 is etched back, the second conductive film CF2 remains not only on the outer peripheral side of the first conductive film CF1 but also on the inner peripheral side thereof. The second conductive film CF2 remaining on the inner peripheral side of the first conductive film CF1 needs to be removed by etching. However, the second gate insulating film GIF2 under the second conductive film CF2 is removed by this etching. Because the second gate insulating film GIF2 is usually very thin, the semiconductor substrate SUB under the second gate insulating film GIF2 (specifically, the portion of the semiconductor substrate SUB where the source region SR is to be formed) is also partially removed.

On the other hand, in the manufacturing method of the semiconductor device according to First Embodiment, the first conductive film CF1 is formed to have the first coupling portion CF1a, the first memory gate portion CF1b, the second memory gate portion CF1c, and the second coupling portion CF1d by being subjected to double patterning (the first patterning step S4 and the second patterning step S9). The second patterning of the first conductive film CF1 (the second patterning step S9) is not performed at the time when the etch-back of the second conductive film CF2 (the etch-back step S8) is performed.

Therefore, the second conductive film CF2 remains only on the outer peripheral side of the first conductive film CF1 after the etch-back of the second conductive film CF2 is performed. Therefore, according to the manufacturing method of the semiconductor device of First Embodiment, the semiconductor substrate SUB in the portion where the source region SR is to be formed can be suppressed from being partially removed.

Second Embodiment

Hereinafter, the configuration of a semiconductor device according to Second Embodiment will be described. In the following description, the configurations different from those of the semiconductor device according to First Embodiment will be described, and duplicate description will not be repeated.

The configuration of a semiconductor device according to Second Embodiment is the same as that of the semiconductor device according to First Embodiment in that the former includes the semiconductor substrate SUB, the first conductive film CF1, the second conductive film CF2, the first gate insulating film GIF1, the second gate insulating film GIF2, the insulating spacer ISS1, the wiring WL2a, and the wiring WL2b (or the wiring WL2c).

Figure 20:
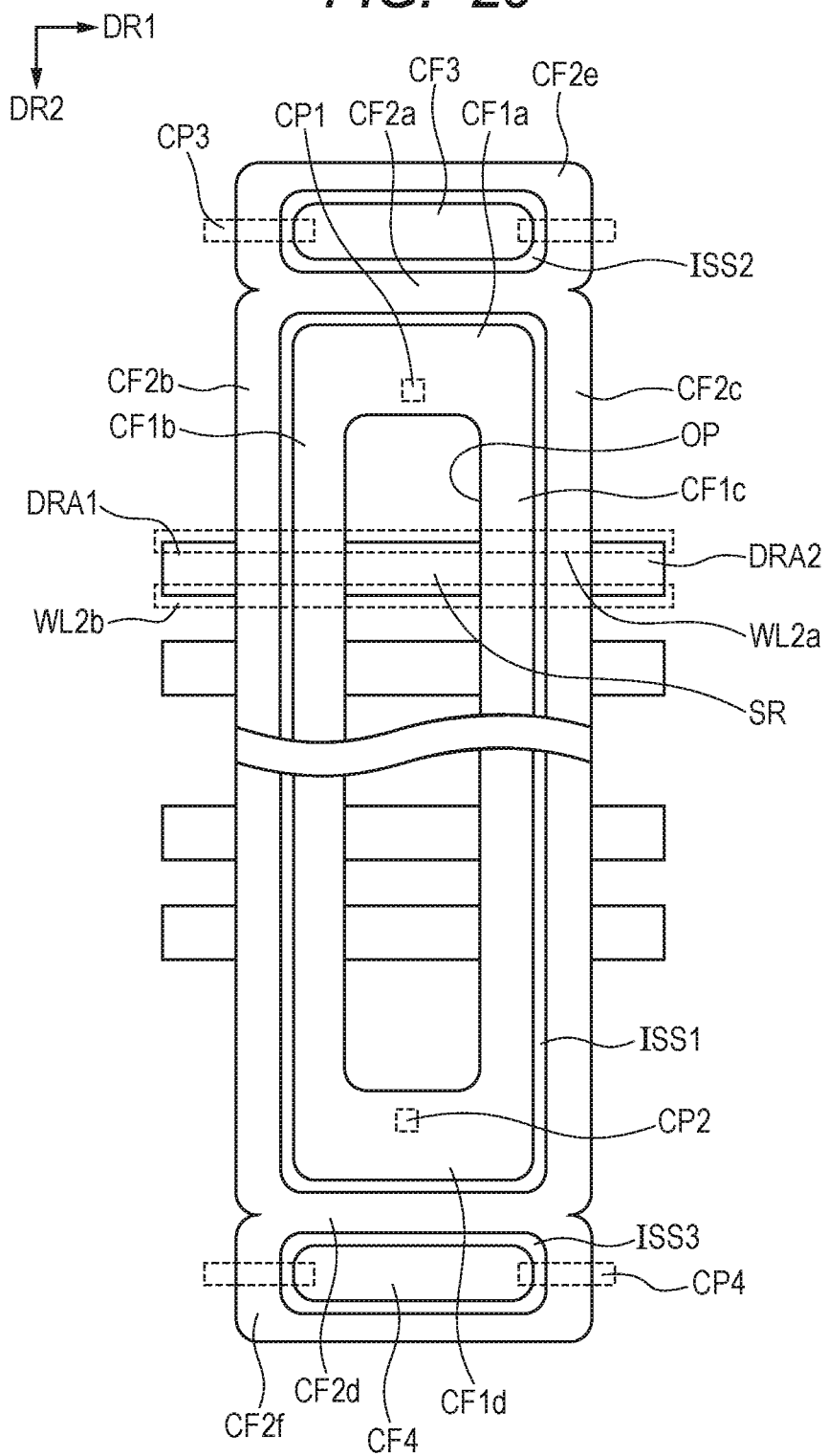
FIG. 20 is an enlarged layout view of a memory cell array MCA of a semiconductor device according to Second Embodiment.

However, the semiconductor device according to Second Embodiment further includes a third conductive film CF3, a fourth conductive film CF4, an insulating spacer ISS2, and an insulating spacer ISS3, as illustrated in FIG. 20. Regarding these points, the configuration of the semiconductor device according to Second Embodiment is different from that of the semiconductor device according to First Embodiment. In the following description, these differences will be mainly described.

The third conductive film CF3 and the fourth conductive film CF4 extend along the first direction DR1. The third conductive film CF3 is arranged to be spaced apart from the first conductive film CF1 (the first coupling portion CF1a) in the second direction DR2. The fourth conductive film CF4 is arranged to be spaced apart from the first conductive film CF1 (the second coupling portion CF1d) in the second direction DR2. That is, the third conductive film CF3 sandwiches the third coupling portion CF2a with the first coupling portion CF1a in the second direction DR2, and the fourth conductive film CF4 sandwiches the fourth coupling portion CF2d with the second coupling portion CF1d in the second direction DR2. The third conductive film CF3 and the fourth conductive film CF4 have a third rectangular shape in plan view. The third rectangular shape has a side parallel to the first direction DR1 and a side parallel to the second direction DR2.

The insulating spacer ISS2 surrounds the outer periphery of the third conductive film CF3 in plan view. The insulating spacer ISS3 surrounds the outer periphery of the fourth conductive film CF4 in plan view.

In plan view, the second conductive film CF2 surrounds the outer periphery of the third conductive film CF3 via the insulating spacer ISS2 and surrounds the outer periphery of the fourth conductive film CF4 via the insulating spacer ISS3. More specifically, the second conductive film CF2 further includes a fifth coupling portion CF2e and a sixth coupling portion CF2f. The fifth coupling portion CF2e surrounds, with the third coupling portion CF2a, the outer periphery of the third conductive film CF3 in plan view. The sixth coupling portion CF2f surrounds, with the fourth coupling portion CF2d, the outer periphery of the fourth conductive film CF4 in plan view.

The contact plug CP3 is electrically coupled to the fifth coupling portion CF2e. The contact plug CP4 is electrically coupled to the sixth coupling portion CF2f. From another point of view, this means that the fifth coupling portion CF2e and the sixth coupling portion CF2f serve as a shunt region of the second conductive film CF2. In plan view, the contact plug CP3 (contact plug CP4) is arranged to straddle the fifth coupling portion CF2e and to reach the third conductive film CF3 (to straddle the sixth coupling portion CF2f and to reach the fourth conductive film CF4).

The third conductive film CF3 and the fourth conductive film CF4 are electrically separated from the first conductive film CF1 by the insulating spacer ISS2 and the insulating spacer ISS3, respectively. Therefore, even if the contact plug CP3 is arranged to reach the third conductive film CF3 (the contact plug CP4 is arranged to reach the fourth conductive film CF4), the first conductive film CF1 and the second conductive film CF2 are not short-circuited. Further, because the contact plug CP3 (contact plug CP4) is arranged to straddle the fifth coupling portion CF2e (the sixth coupling portion CF2f), the contact area with the fifth coupling portion CF2e (the sixth coupling portion CF2f) can be secured even if the contact plug CP3 (the contact plug CP4) is formed at a shifted position.

Hereinafter, a manufacturing method of the semiconductor device according to Second Embodiment will be described. In the following description, the steps different from those of the manufacturing method of the semiconductor device according to First Embodiment will be described, and duplicate description will not be repeated.

A manufacturing method of the semiconductor device according to Second Embodiment includes the semiconductor substrate provision step S1, the first gate insulating film formation step S2, the first conductive film formation step S3, the first patterning step S4, the insulating spacer formation step S5, the second gate insulating film formation step S6, the second conductive film formation step S7, the etch-back step S8, and the second patterning step S9.

In the manufacturing method of the semiconductor device according to Second Embodiment, the first patterning step S4 includes the hard mask formation step S41, the hard mask patterning step S42, and the etching step S43. Regarding these points, the manufacturing method of the semiconductor device according to Second Embodiment is the same as that of the semiconductor device according to First Embodiment.

In the manufacturing method of the semiconductor device according to Second Embodiment, however, details of the hard mask patterning step S42, those of the insulating spacer formation step S5, and those of the etch-back step S8 are different from the details of the manufacturing method of the semiconductor device according to First Embodiment. In the following description, these differences will be mainly described.

Figure 21:
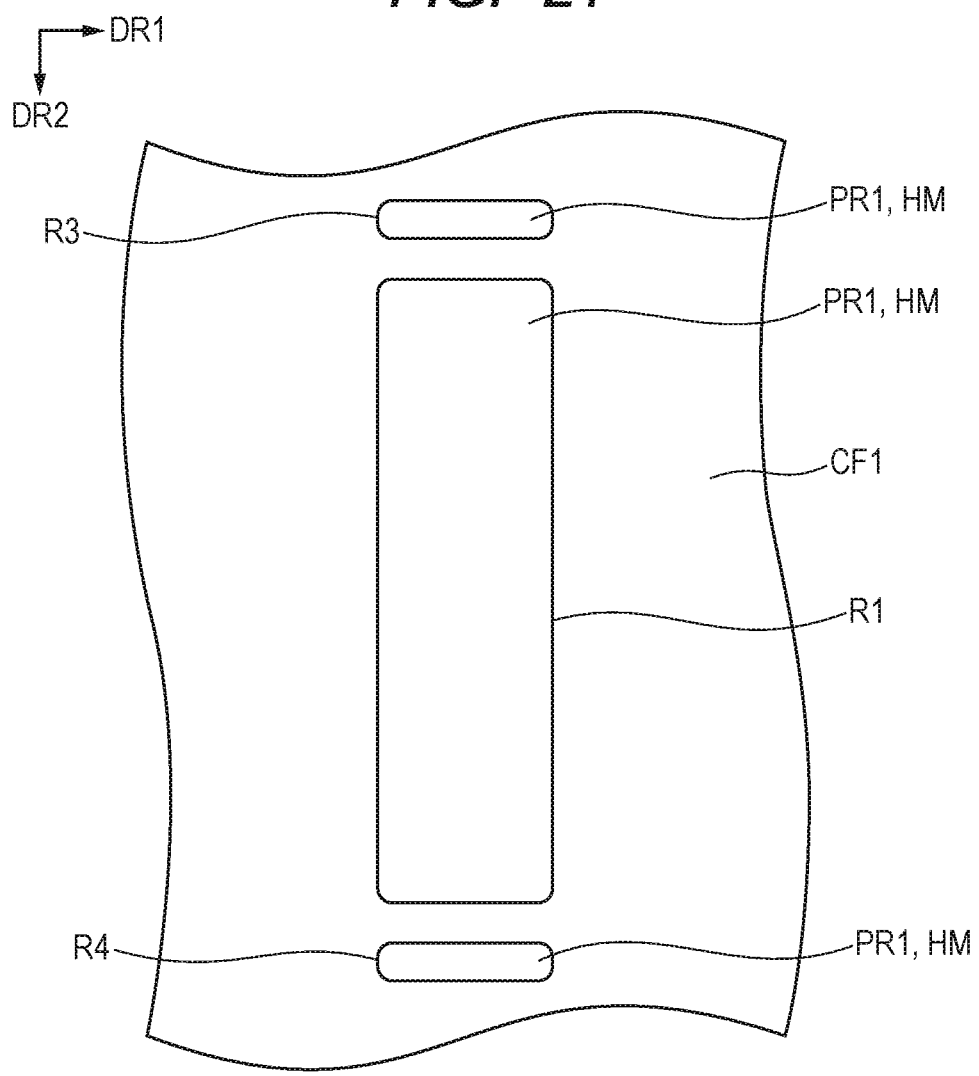
FIG. 21 is a top view of the semiconductor device according to Second Embodiment in a hard mask patterning step S42.

In the hard mask patterning step S42, the hard mask HM (and photoresist PR1) is patterned to cover the first region R1, the third region R3, and the fourth region R4, as illustrated in FIG. 21. The third region R3 is spaced apart from the first region R1 in the second direction DR2. The fourth region R4 is spaced apart from the first region R1 in the second direction DR2. The third region R3 and the fourth region R4 have the third rectangular shape in plan view. The third region R3 and the fourth region R4 are located opposite to each other with respect to the first region R1 in the second direction DR2. Therefore, the first conductive film CF1 is patterned in the etching step S43 such that the third conductive film CF3 and the fourth conductive film CF4 remain in addition to the first conductive film CF1.

Because the third conductive film CF3 and the fourth conductive film CF4 remain after the etching step S43 is performed, the insulating spacer ISS1 is formed over the side wall of the first conductive film CF1, the insulating spacer ISS2 is formed over the side wall of the third conductive film CF3, and the insulating spacer ISS3 is formed over the side wall of the fourth conductive film CF4 in the insulating spacer formation step S5.

Figure 22:
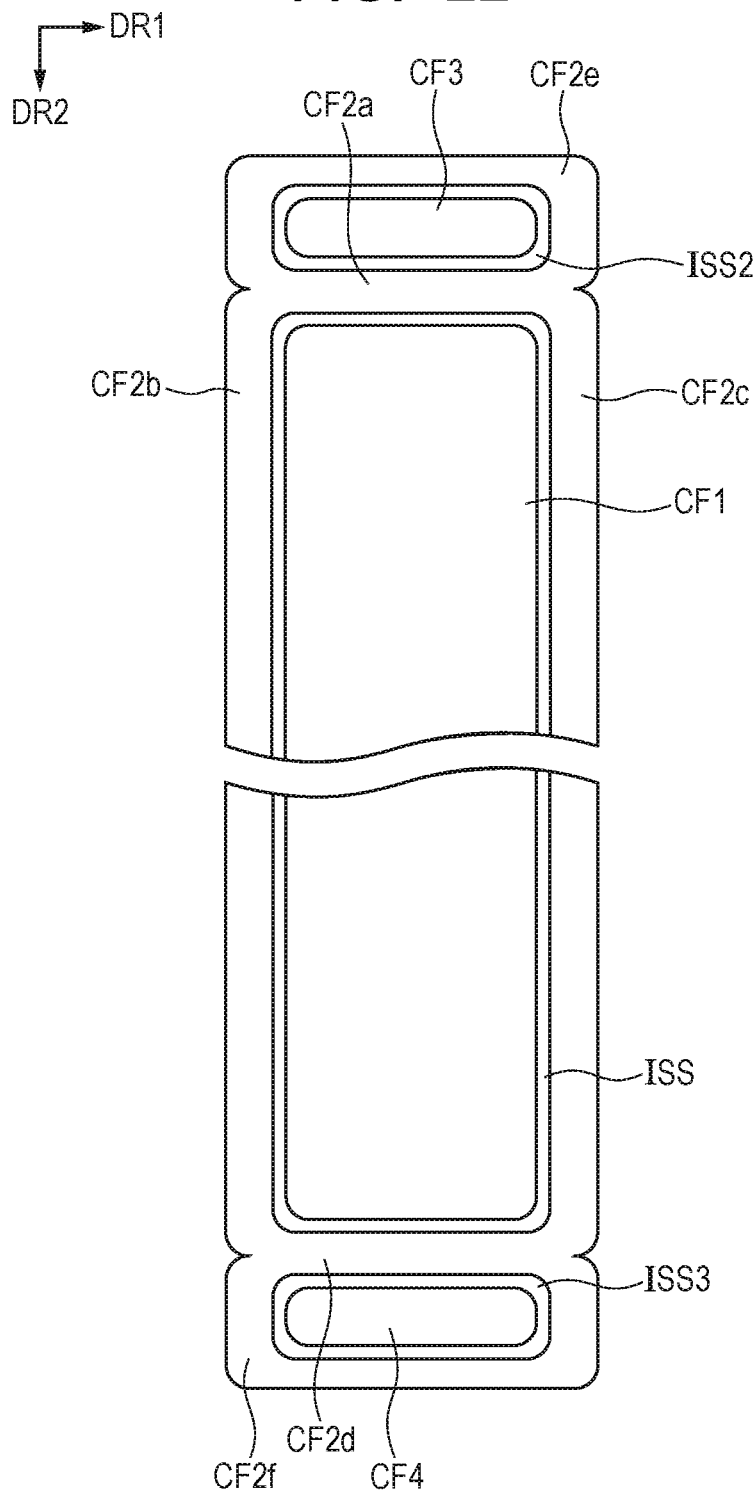
FIG. 22 is a top view of the semiconductor device according to Second Embodiment in an etch-back step S8.

In the manufacturing method of the semiconductor device according to Second Embodiment, the third conductive film CF3 and the fourth conductive film CF4 are formed at the time when the etch-back step S8 is performed, as illustrated in FIG. 22. Therefore, the second conductive film CF2 remains along the side walls of the third conductive film CF3 and the fourth conductive film CF4 by performing etch-back in the etch-back step S8. The remaining second conductive film CF2 serves as the fifth coupling portion CF2e and the sixth coupling portion CF2f.

Hereinafter, the advantages of the semiconductor device according to Second Embodiment will be described. In the following description, the advantages different from those of the semiconductor device according to First Embodiment will be mainly described, and duplicate description will not be repeated.

In the semiconductor device according to First Embodiment, the width of the shunt region of the second conductive film CF2 cannot be made equal to or larger than the width of the third coupling portion CF2a (the width of the fourth coupling portion CF2d). Therefore, when any mask shift occurs in forming the contact hole CH, there is the fear that: the contact plug CP3 may not be electrically coupled to the third coupling portion CF2a (the contact plug CP4 may not be electrically coupled to the fourth coupling portion CF2d); or the contact plug CP3 may be electrically coupled to both the first coupling portion CF1a and the third coupling portion CF2a (the contact plug CP4 may be electrically coupled to both the second coupling portion CF1d and the fourth coupling portion CF2d).

On the other hand, in the semiconductor device according to Second Embodiment, the contact plug CP 3 may be formed to straddle the fifth coupling portion CF2e and the third conductive film CF3 (the contact plug CP4 may be formed to straddle the sixth coupling portion CF2f and the fourth conductive film CF4), and hence the shunt region of the second conductive film CF2 can be secured relatively widely. Therefore, according to the semiconductor device of Second Embodiment, the following situations can be suppressed in which: the contact plug CP3 (the contact plug CP4) may not be electrically coupled to the second conductive film CF2; and the first conductive film CF1 and the second conductive film CF2 may be short-circuited.

Third Embodiment

Hereinafter, the configuration of a semiconductor device according to Third Embodiment will be described. In the following description, the configurations different from those of the semiconductor device according to First Embodiment will be described, and duplicate description will not be repeated.

The configuration of a semiconductor device according to Third Embodiment is the same as that of the semiconductor device according to First Embodiment in that the former includes the semiconductor substrate SUB, the first conductive film CF1, the second conductive film CF2, the first gate insulating film GIF1, the second gate insulating film GIF2, the insulating spacer ISS1, and the wiring WL2c.

Figure 23:
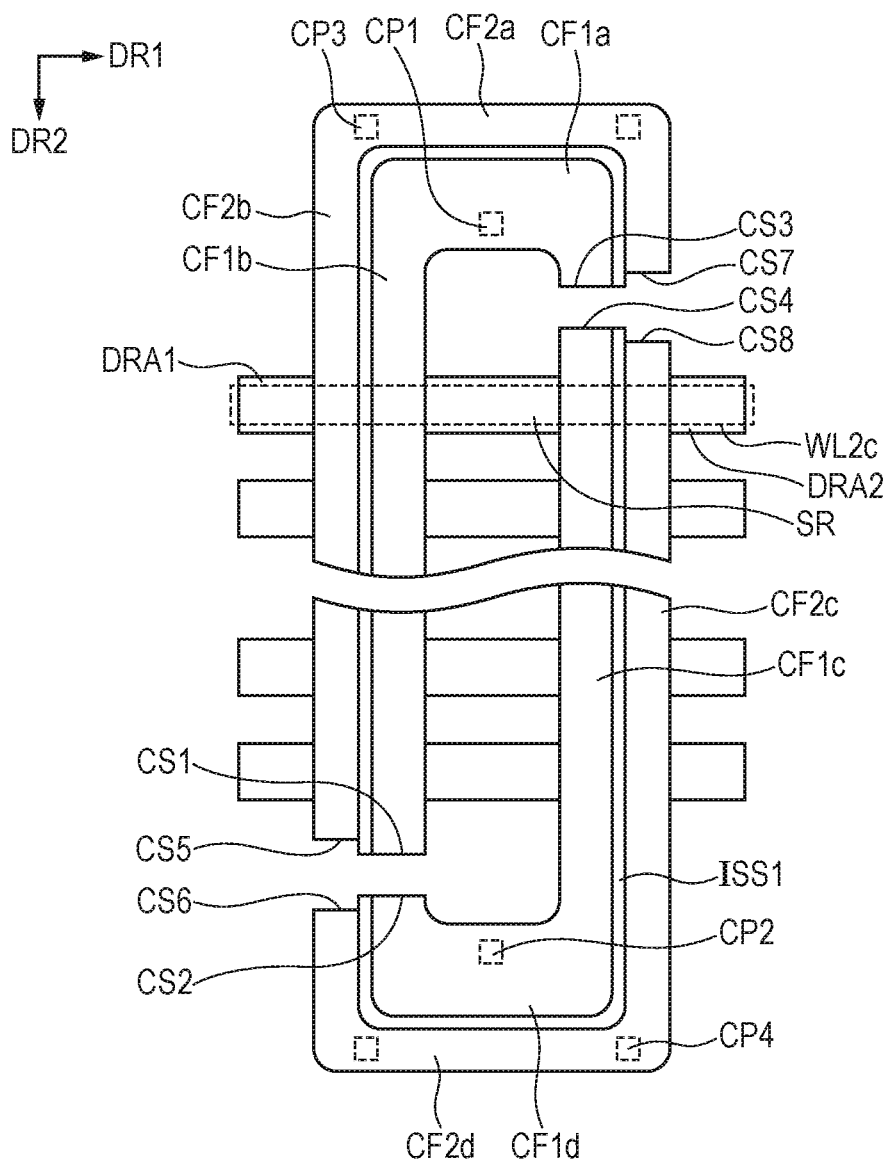
FIG. 23 is an enlarged layout view of a memory cell array MCA of a semiconductor device according to Third Embodiment.

In the semiconductor device according to Third Embodiment, however, a first cut surface CS1 and a second cut surface CS2 are provided in the first memory gate portion CF1b, and a third cut surface CS3 and a fourth cut surface CS4 are provided in the second memory gate portion CF1c, as illustrated in FIG. 23. Also, a fifth cut surface CS5 and a sixth cut surface CS6 are provided in the first control gate portion CF2b, and a seventh cut surface CS7 and an eighth cut surface CS8 are provided in the second control gate portion CF2c. Regarding these points, the configuration of the semiconductor device according to Third Embodiment is different from that of the semiconductor device according to First Embodiment. In the following description, these differences will be mainly described.

The first cut surface CS1 and the second cut surface CS2 cross the second direction DR2. The first cut surface CS1 and the second cut surface CS2 preferably cross the second direction DR2 at right angles. The first cut surface CS1 and the second cut surface CS2 face each other by being spaced apart from each other in the second direction DR2. That is, the first memory gate portion CF1b is removed between the first cut surface CS1 and the second cut surface CS2.

The third cut surface CS3 and the fourth cut surface CS4 cross the second direction DR2. The third cut surface CS3 and the fourth cut surface CS4 preferably cross the second direction DR2 at right angles. The third cut surface CS3 and the fourth cut surface CS4 face each other by being spaced apart from each other in the second direction DR2. That is, the second memory gate portion CF1c is removed between the third cut surface CS3 and the fourth cut surface CS4.

The fifth cut surface CS5 and the sixth cut surface CS6 cross the second direction DR2. The fifth cut surface CS5 and the sixth cut surface CS6 preferably cross the second direction DR2 at right angles. The fifth cut surface CS5 and the sixth cut surface CS6 face each other by being spaced apart from each other in the second direction DR2. That is, the first control gate portion CF2b is removed between the fifth cut surface CS5 and the sixth cut surface CS6.

The seventh cut surface CS7 and the eighth cut surface CS8 cross the second direction DR2. The seventh cut surface CS7 and the eighth cut surface CS8 preferably cross the second direction DR2 at right angles. The seventh cut surface CS7 and the eighth cut surface CS8 face each other by being spaced apart from each other in the second direction DR2. That is, the second control gate portion CF2c is removed between the seventh cut surface CS7 and the eighth cut surface CS8.

The first cut surface CS1 and the second cut surface CS2 are located between the fifth cut surface CS5 and the sixth cut surface CS6 in plan view. The third cut surface CS3 and the fourth cut surface CS4 are located between the seventh cut surface CS7 and the eighth cut surface CS8 in plan view. That is, the first control gate portion CF2b is removed in a wider range in the second direction DR2 than the first memory gate portion CF1b, and the second control gate portion CF2c is removed in a wider range in the second direction DR2 than the second memory gate portion CF1c.

Hereinafter, a manufacturing method of the semiconductor device according to Third Embodiment will be described. In the following description, the steps different from those of the manufacturing method of the semiconductor device according to First Embodiment will be described, and duplicate description will not be repeated.

A manufacturing method of the semiconductor device according to Third Embodiment includes the semiconductor substrate provision step S1, the first gate insulating film formation step S2, the first conductive film formation step S3, the first patterning step S4, the insulating spacer formation step S5, the second gate insulating film formation step S6, the second conductive film formation step S7, the etch-back step S8, and the second patterning step S9.

In the manufacturing method of the semiconductor device according to Third Embodiment, the first patterning step S4 has the hard mask formation step S41, the hard mask patterning step S42, and the etching step S43. Regarding these points, the manufacturing method of the semiconductor device according to Third Embodiment is the same as that of the semiconductor device according to First Embodiment.

Figure 24:
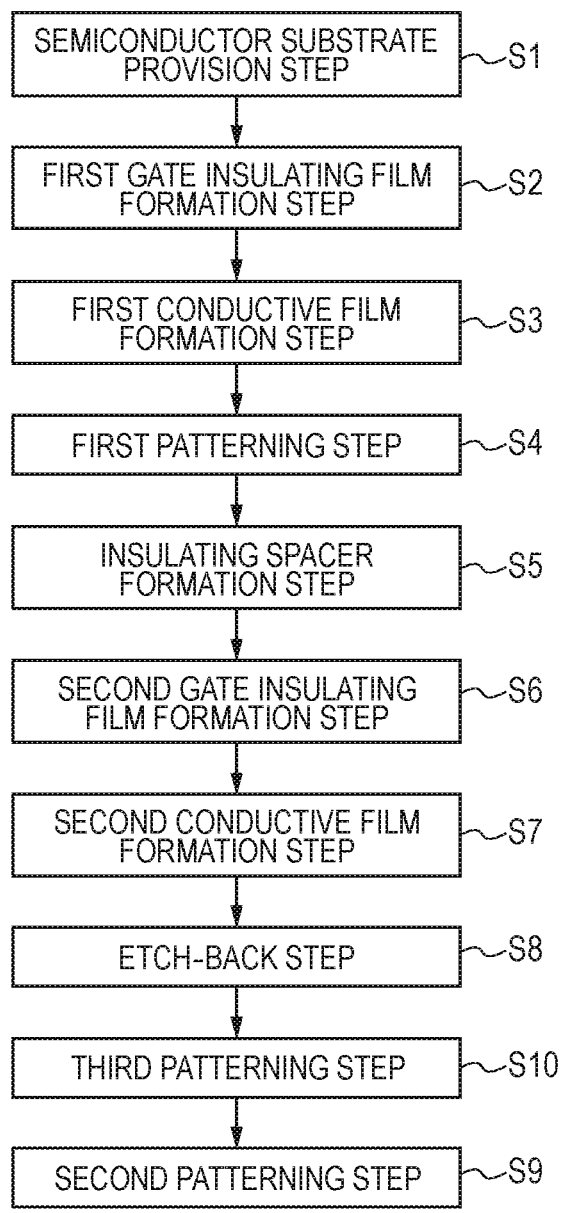
FIG. 24 is a step chart showing a manufacturing method of the semiconductor device according to Third Embodiment.

However, the manufacturing method of the semiconductor device according to Third Embodiment further includes a third patterning step S10, as illustrated in FIG. 24. In the manufacturing method according to Third Embodiment, the details of the second patterning step S9 are different from those of the second patterning step S9 in the manufacturing method of the semiconductor device according to First Embodiment. Regarding these points, the manufacturing method of the semiconductor device according to Third Embodiment is different from that of the semiconductor device according to First Embodiment. In the following description, these differences will be mainly described.

Figure 25:
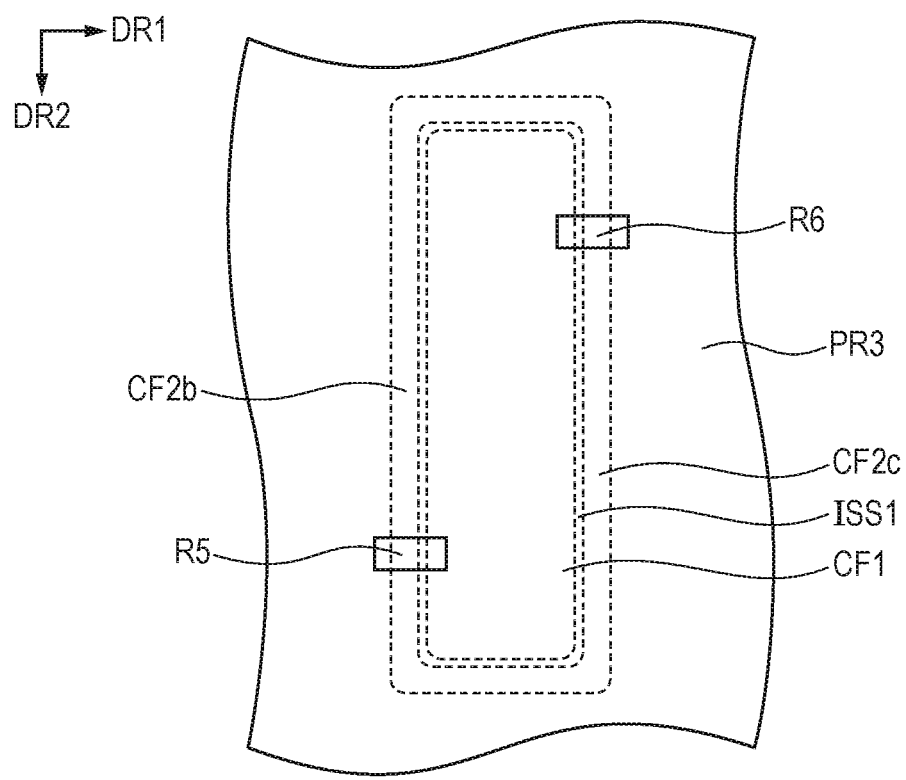
FIG. 25 is a top view of the semiconductor device according to Third Embodiment in a third patterning step S10.

The third patterning step S10 is performed after the etch-back step S8 and before the second patterning step S9. In the third patterning step S10, a photoresist PR3 is firstly formed. The photoresist PR 3 has openings in a fifth region R5 and a sixth region R6, as illustrated in FIG. 25.

The fifth region R5 and the sixth region R6 have a fourth rectangular shape. The fourth rectangular shape has a side parallel to the first direction DR1 and a side parallel to the second direction DR2. The fifth region R5 is arranged to straddle the first control gate portion CF2b along the first direction DR1 and to reach the first conductive film CF1. The sixth region R6 is arranged to straddle the second control gate portion CF2c along the first direction DR1 and to reach the first conductive film CF1. Thereby, the fifth cut surface CS5, the sixth cut surface CS6, the seventh cut surface CS7, and the eighth cut surface CS8 can be formed even if any mask shift along the first direction DR1 occurs when the photoresist PR3 is formed. Even though the fifth region R5 and the sixth region R6 are arranged to reach the first conductive film CF1 in the first direction DR1, the first conductive film CF1 is not etched in the third patterning step S10, because the hard mask HM is located over the upper surface of the first conductive film CF1.

In the third patterning step S10, etching is secondly performed by using the photoresist PR3. This etching is, for example, anisotropic etching such as RIE. Thereby, the first control gate portion CF2b is partially removed, so that the fifth cut surface CS5 and the sixth cut surface CS6 are formed. Also, the second control gate portion CF2c is partially removed by this etching, so that the seventh cut surface CS7 and the eighth cut surface CS8 are formed.

Figure 26:
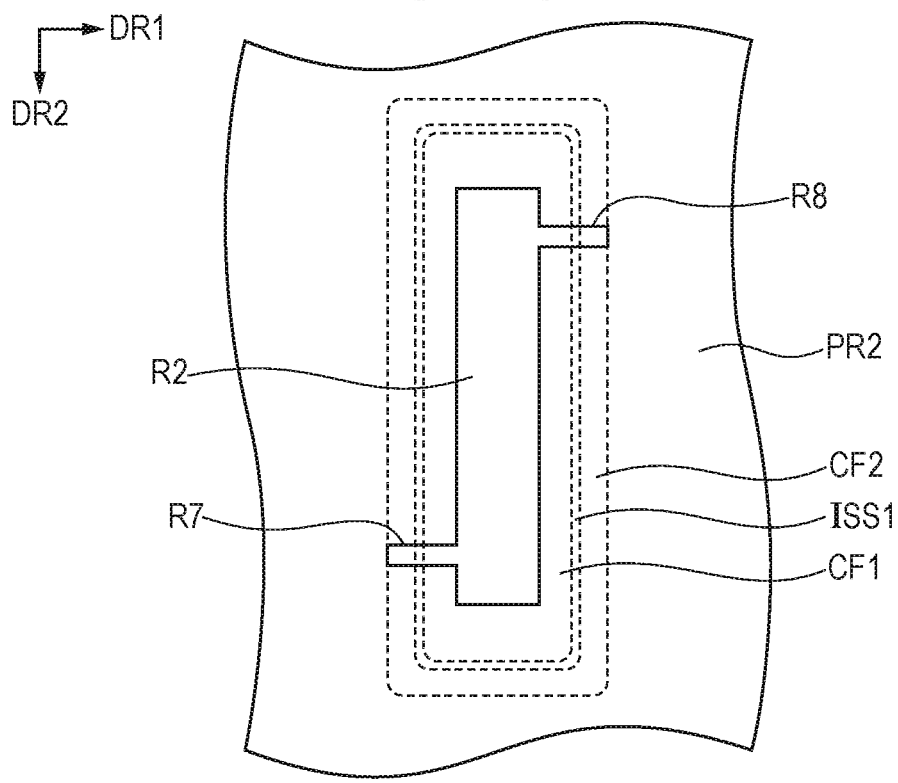
FIG. 26 is a top view of the semiconductor device according to Third Embodiment in a second patterning step S9.

In the second patterning step S9, openings are provided in the second region R2, the seventh region R7, and the eighth region R8 of the photoresist PR2, as illustrated in FIG. 26. The seventh region R7 and the eighth region R8 have a fifth rectangular shape. The fifth rectangular shape has a side parallel to the first direction DR1 and a side parallel to the second direction DR2 in plan view. The widths of the seventh region R7 and the eighth region R8 in the second direction DR2 are smaller than those of the fifth region R5 and the sixth region R6 in the second direction DR2.

The seventh region R7 is arranged such that it overlaps the fifth region R5 in the second direction DR2 and the end, in the first direction DR1, of it reaches the second region R2. The eighth region R8 is arranged such that it overlaps the sixth region R6 in the second direction DR2 and the end, in the first direction DR1, of it reaches the second region R2.

By etching the first conductive film CF1 with the use of the photoresist PR2 provided with the second region R2, the seventh region R7, and the eighth region R8, the first coupling portion CF1a, the first memory gate portion CF1b provided with the first cut surface CS1 and the second cut surface CS2, the second memory gate portion CF1c provided with the third cut face CS3 and the fourth cut face CS4, and the second coupling portion CF1d are formed.

Hereinafter, the advantages of the semiconductor device according to Third Embodiment will be described. In the following description, the advantages different from those of the semiconductor device according to First Embodiment will be mainly described, and duplicate description will not be repeated.

In the semiconductor device according to Third Embodiment, the first memory gate portion CF1b, the second memory gate portion CF1c, the first control gate portion CF2b, and the second control gate portion CF2c are cut in the middle. Therefore, the flash memory cell MC1 and the flash memory cell MC2 can be operated independently of each other in the semiconductor device according to Third Embodiment.

In the semiconductor device according to Third Embodiment, the cut surface provided in the first control gate portion CF2b recedes from the cut surface provided in the first memory gate portion CF1b, and the cut surface provided in the second control gate portion CF2c recedes from the cut surface provided in the second memory gate portion CF1c. Therefore, according to the semiconductor device of Third Embodiment, the withstand voltage between the first conductive film CF1 and the second conductive film CF2 is easy to secure, even if the first conductive film CF1 and the second conductive film CF2 have a cut surface.

The invention made by the present inventors has been specifically described above based on preferred embodiments, but it is needless to say that the invention should not be limited to the preferred embodiments and various modifications may be made to the invention within a range not departing from the gist of the invention.

What is claimed is:

1. A semiconductor device comprising:
a semiconductor substrate having a first surface;
a first conductive film that is located over the first surface and is formed to circle in plan view;
a second conductive film that is located over the first surface and surrounds an outer periphery of the first conductive film in plan view;
a first insulating spacer located between the first conductive film and the second conductive film;
a first gate insulating film that is located between the first surface and the first conductive film; and
a second gate insulating film located between the first surface and the second conductive film,
wherein the first conductive film has a first memory gate portion and a second memory gate portion,
wherein in plan view, the first memory gate portion and the second memory gate portion are spaced apart from each other in a first direction and extend along a second direction perpendicular to the first direction,
wherein the second conductive film has a first control gate portion extending along the first memory gate portion and a second control gate portion extending along the second memory gate portion,
wherein the semiconductor substrate has a first drain region located in the first surface, a source region located in the first surface, and a second drain region located in the first surface,
wherein the first memory gate portion and the first control gate portion are sandwiched by the first drain region and the source region in plan view,
wherein the second memory gate portion and the second control gate portion are sandwiched by the second drain region and the source region in plan view, and
wherein the first gate insulating film is an aluminum hafnium aluminum oxide film.

2. The semiconductor device according to claim 1, further comprising:
a third conductive film that is arranged to be spaced apart from the first conductive film in the second direction and extends along the first direction; and
a second insulating spacer surrounding an outer periphery of the third conductive film in plan view,
wherein in plan view, the second conductive film further surrounds the outer periphery of the third conductive film via the second insulating spacer.

3. The semiconductor device according to claim 2, further comprising:
a hard mask that is arranged over an upper surface of the first conductive film and includes an insulator.

4. The semiconductor device according to claim 3,
wherein the first gate insulating film includes: a first layer that is arranged over the first surface and includes silicon oxide or silicon oxynitride; a second layer that is arranged over the first layer and includes aluminum oxide; a third layer that is arranged over the second layer and includes hafnium silicate; and a fourth layer that is arranged over the third layer and includes aluminum oxide, and
wherein an accumulated amount of charges of the first gate insulating film changes due to a change in a voltage between the first conductive film and the semiconductor substrate.

5. The semiconductor device according to claim 4, further comprising:
a first bit line extending along the first direction; and
a second bit line extending along the first direction,
wherein the first bit line is electrically coupled to the first drain region, and
wherein the second bit line is electrically coupled to the second drain region.

6. The semiconductor device according to claim 4, further comprising a third bit line extending along the first direction,
wherein the third bit line is electrically coupled to the first drain region and the second drain region.

7. The semiconductor device according to claim 1,
wherein the first memory gate portion includes a first cut surface crossing the second direction and a second cut surface facing the first cut surface, the second cut surface being spaced apart from the first cut surface in the second direction,
wherein the second memory gate portion includes a third cut surface crossing the second direction and a fourth cut surface facing the third cut surface, the fourth cut surface being spaced apart from the third cut surface in the second direction,
wherein the first control gate portion includes a fifth cut surface crossing the second direction and a sixth cut surface facing the fifth cut surface, the sixth cut surface being spaced apart from the fifth cut surface in the second direction,
wherein the second control gate portion includes a seventh cut surface crossing the second direction and an eighth cut surface facing the seventh cut surface, the eighth cut surface being spaced apart from the seventh cut surface in the second direction,
wherein the first cut surface and the second cut surface are located between the fifth cut surface and the sixth cut surface, and
wherein the third cut face and the fourth cut face are located between the seventh cut face and the eighth cut face.

8. The semiconductor device according to claim 7, further comprising a third bit line extending along the first direction,
wherein the third bit line is electrically coupled to the first drain region and the second drain region.

9. A manufacturing method of a semiconductor device, comprising the steps of:
forming a first gate insulating film over a first surface of a semiconductor substrate;
forming a first conductive film over the first gate insulating film;
performing first patterning the first gate insulating film and the first conductive film by using a first mask arranged over the first conductive film;
forming an insulating spacer over a side wall of the first conductive film;
forming a second conductive film so as to cover the first conductive film;
etching back the second conductive film; and
performing second patterning the first conductive film by using a second mask arranged over the first conductive film,
wherein the first mask covers a first region of a first rectangular shape and the first region includes a side parallel to a first direction in plan view and a side parallel to a second direction perpendicular to the first direction,
wherein the second mask is provided with an opening in a second region of a second rectangular shape and the second region includes a side parallel to the first direction in plan view and a side parallel to the second direction, and
wherein the second region is located inside the first region in plan view.

10. The manufacturing method of a semiconductor device according to claim 9,
wherein the first mask further has a third region of a third rectangular shape and the third region includes a side parallel to the first direction in plan view and a side parallel to the second direction and a fourth region of the third rectangular shape, and
wherein the third region and the fourth region are located on opposite sides with respect to the first region in the second direction, and are spaced apart from the first region in the second direction.

11. The manufacturing method of a semiconductor device according to claim 10, wherein the first mask includes a hard mask including an insulator.

12. The manufacturing method of a semiconductor device according to claim 11, further comprising the step of:
after the etching back and before the performing second patterning, performing third patterning for partially removing the second conductive film etched in the etching back,
wherein the first conductive film patterned in the second patterning includes a first memory gate portion extending along the second direction and a second memory gate portion extending along the second direction and is arranged to be spaced apart from the first memory gate portion in the first direction,
wherein the second conductive film etched in the etching back includes a first control gate portion extending along the first memory gate portion and a second control gate portion extending along the second memory gate portion,
wherein in the performing third patterning, a fifth cut surface crossing the second direction and a sixth cut surface facing the fifth cut surface and being spaced apart from the fifth cut surface in the second direction are formed in the first control gate portion, and a seventh cut surface crossing the second direction and an eighth cut surface facing the seventh cut surface and being spaced away from the seventh cut surface in the second direction are formed in the second control gate portion,
wherein in the performing second patterning, a first cut surface crossing the second direction and a second cut surface facing the first cut surface and being spaced apart from the first cut surface in the second direction are formed in the first memory gate portion, and a third cut surface crossing the second direction and a fourth cut surface facing the third cut surface and being spaced apart from the third cut surface in the second direction are formed in the second memory gate portion,
wherein the first cut surface and the second cut surface are located between the fifth cut surface and the sixth cut surface, and
wherein the third cut surface and the fourth cut surface are located between the seventh cut surface and the eighth cut surface.

13. The semiconductor device according to claim 1, wherein the first insulating spacer includes silicon oxide or silicon oxynitride.

* * * * *